United States Patent
Sakuragi et al.

(10) Patent No.: US 6,518,910 B2
(45) Date of Patent: Feb. 11, 2003

(54) SIGNAL PROCESSING APPARATUS HAVING AN ANALOG/DIGITAL CONVERSION FUNCTION

(75) Inventors: Takamasa Sakuragi, Hiratsuka (JP); Seiji Hashimoto, Yokohama (JP); Yuichiro Yamashita, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/781,165

(22) Filed: Feb. 13, 2001

(65) Prior Publication Data

US 2001/0020909 A1 Sep. 13, 2001

(30) Foreign Application Priority Data

Feb. 14, 2000 (JP) .................................... 2000-035101
Jun. 2, 2000 (JP) .................................... 2000-166307
Jun. 2, 2000 (JP) .................................... 2000-166308

(51) Int. Cl.⁷ ............................. H03M 1/06; H03M 1/34
(52) U.S. Cl. ...................................... 341/162; 341/118
(58) Field of Search .......................... 341/122, 155, 341/162, 118, 161, 169; 250/300.07; 348/222, 227, 229, 265; 382/124

(56) References Cited

U.S. PATENT DOCUMENTS

| | | | | |
|---|---|---|---|---|
| 5,392,068 A | * | 2/1995 | Suzuki et al. ............... 348/227 |
| 5,877,715 A | * | 3/1999 | Gowda et al. ............... 341/122 |
| 5,880,470 A | * | 3/1999 | Umetani et al. ........ 250/370.09 |
| 5,886,659 A | * | 3/1999 | Pain et al. .................... 341/155 |
| 6,137,432 A | * | 10/2000 | Xiao ............................ 341/169 |
| 6,275,259 B1 | * | 8/2001 | Gowda et al. ............... 348/229 |

* cited by examiner

Primary Examiner—Patrick Wamsley
(74) Attorney, Agent, or Firm—Fitzpatrick, Cella, Harper & Scinto

(57) ABSTRACT

A signal processing apparatus having: a plurality of circuit blocks each circuit block including a signal source and an output transistor adapted to receive a signal generated by the signal source at a control electrode region and output a corresponding signal from a main electrode region; and an analog/digital converter circuit adapted to sequentially process the signal from each of the plurality of circuit blocks, wherein the analog/digital converter circuit includes a reference transistor for receiving a reference level at a control electrode region and outputting a corresponding signal from a main electrode region and a digital output circuit for outputting a digital signal in accordance with a signal output from the output transistor and a signal output from the reference transistor, and wherein the output transistor and reference transistor constitute an input unit of a differential amplifier circuit including the output transistor and reference transistor.

24 Claims, 34 Drawing Sheets

DA OUTPUT
RANGE
SWITCHING
INFORMATION

SIGNAL PROCESSING APPARATUS HAVING AN ANALOG/DIGITAL CONVERSION FUNCTION

BACKGROUND OF THE INVENTION

1. Field of the Invention

The present invention relates to a signal processing circuit, and more particularly to a signal processing circuit having an analog/digital conversion function for converting a signal from a signal source such as a photoelectric conversion unit into a digital signal.

2. Related Background Art

An amplification type image sensor is being studied and developed, in which photoelectrically excited carriers are amplified by active elements in a pixel unit. Such a photoelectric conversion device generally called a CMOS image sensor and various circuits such as logical circuits can be integrated on the same chip. Integration of an image sensor and an A/D converter and other circuits has been studied to date.

Integration of an image sensor and an A/D converter includes, for example, one A/D converter provided for each pixel, one A/D converter provided for each column, one A/D converter provided for the sensor output unit, or the like. Integration of one A/D converter for each column has been studied most vigorously.

The fundamental technology of a conventional A/D converter will be described with reference to FIG. 1. In the following, an A/D converter of the type that only one comparator is used and a conversion result is obtained while changing a reference voltage, will be described illustratively without using a relatively large scale parallel type such as a flash type and a two-step type.

An A/D converter is basically constituted of one comparator and one reference voltage generator.

A comparator 11 has a non-inverting input terminal 12 and an inverting input terminal 13. If an input to the non-inverting input terminal 12 is larger than an input to the inverting input terminal 13, a logical high level (usually a power source voltage) is output from a comparator output terminal 14, whereas if it is smaller, a logical low level (usually a GND level) is output.

In order to realize an A/D converter by using the comparator, a comparison reference voltage 15 is input to the inverting input terminal and a voltage 16 to be A/D converted is input to the non-inverting input terminal.

A comparison reference voltage generator unit outputs a ramp voltage which is synchronous with a digital counter and monotonously increases its amplitude, i.e., a derivative of the voltage with respect to time is always positive during each A/D conversion operation. A digital value is obtained from a count of the counter when an output of the comparator 11 is inverted.

In the case of a sequential comparison type, in accordance with an A/D conversion result obtained sequentially from the upper bit, the next reference voltage is determined and this operation is repeated.

If an output voltage from a photoelectric conversion element (e.g., a photodiode) is input to the non-inverting input terminal, the A/D converter converts input light into a digital signal.

The terms "inverting" and "non-inverting" are named after the output logic. There is no strict discrimination therebetween if only the transition of the output from the low level to the high level or vice versa is taken into consideration. In the following description, even if inverting is replaced by non-inverting, there is no practical problem. In this case, the logic of an encoder at the back stage may be changed or a protocol for processing the result after A/D conversion may be is changed.

Next, with reference to FIG. 2, the fundamental technology of an A/D converter used by a CMOS image sensor having one A/D converter per one column (hereinafter called a column A/D type CMOS sensor) will be described.

In an active pixel type sensor such as a CMOS sensor, generally a plurality of voltage sources, i.e., pixels, are connected in parallel to one common column 21. The amount of optically induced current of each pixel is too small and the generated voltage is insufficient for driving the column. To solve this, generally, an impedance conversion amplifier called a source follower is provided to supply its output to the column. The photoelectric conversion results of respective pixels are equivalently considered as voltage sources 22, 23 and 24. An output of each voltage source is selected by a corresponding one of select switches 25, 26 and 27 and supplied to the column to enable selective data read. Reference numeral 28 represents a constant current source for the source followers.

In the column A/D type CMOS sensor, a voltage selectively read in the above manner is supplied to a compartor 29 at which the voltage is compared with a reference voltage 30 to attain conversion.

The column A/D type CMOS operating on the basis of the above-described principle is associated with the following problems.

A first problem is concerned about consumption current. If an A/D converter is not provided for each column, the current consumed at each column is only current 28 for the source followers. In a column A/D type CMOS sensor, consumption current of the comparator (generally constituted mainly of a differential amplifier) 29 is required in addition to the consumption current by the source followers. A general image sensor has several hundred to several thousand columns. The total consumption power is therefore several hundred to several thousand times the consumption power of one column, and an increase in the consumption power cannot be neglected.

A second problem is concerned about a variation in gains of A/D converters. There is a variation in the conversion characteristics of A/D converters provided for columns. This variation appears as a differential non-linear error and an integration non-linear error which are caused by an offset voltage variation in initial stage differential amplifiers in A/D converters and a variation in performances of reference voltage generators, and the like. If the characteristics of A/D converters of respective columns are different, vertical fogged stripes are formed in an image and the image quality is degraded.

A third problem is concerned about a variation in input-output characteristics, particularly, amplification factors, of source followers. There is a general tendency that the gate length and width of a MOS transistor are shortened and narrowed in order to increase the integration degree. An image sensor has also this tendency. At such a high integration degree, there a variation in gains of source followers to be caused by variations of mutual conductances gm and differential source/drain resistances rds generated by a variation in manufacture processes. A variation in gains is several % at the most and a picked-up image is fogged.

FIG. 3 shows the structures of a conventional MOS type solid state image pickup device and an A/D converter for A/D converting an analog voltage signal of the image pickup device, and FIG. 4 is a timing chart illustrating the operation. A unit cell is constituted of a photodiode 81, an amplifying transistor 82, a select transistor 83 and a reset transistor 84.

A signal accumulated in a photodiode 81 (81-1-1, 81-1-2, . . . ) of each cell is amplified by an amplifying transistor 82 (82-1-1, 82-1-2, . . . ) and read out to a vertical signal line or detection node 88 (88-1, 88-2, . . . ) in the form of voltage. Since the amplifying transistor 82 and a load transistor 89 (89-1, 89-2, . . . ) form a source follower, a voltage corresponding to the signal in the photodiode 81 is read out to the vertical signal line 88. The MOS type solid image pickup device constructed as above is associated with a problem of fixed pattern noises corresponding to a variation in threshold voltages of amplifying transistors 82. Therefore, a noise canceling circuit is generally used, the operation of which will be described in the following.

By applying a pulse 501 to a select signal line 86-1, the row of the amplifying transistors 82-1-1, 82-1-2, . . . is activated. At this time, output signal voltages corresponding to the signals accumulated in the photodiodes 81-1-1, 81-1-2, . . . are read out to the vertical signal lines 88 (88-1, 88-2, . . . ). During the "H" level (pulse 501) activating the cells, an "H" voltage (pulse 502) is applied to a terminal 123 connected to the gate of a clamp transistor 91 to clamp the vertical signal line 95 (95-1, 95-2, . . . ) to a clamp voltage applied to a terminal 124.

Thereafter, an "H" voltage (pulse 503) is applied to a reset signal line 87 (87-1, 87-2, . . . ) to reset the voltage of the photodiode 81 (81-1-1, 81-1-2, . . . ). This reset voltage appears at the vertical signal line 88 and is transmitted via a clamp capacitor 90 (90-1, 90-2, . . . ) to a vertical signal line 95 (95-1, 95-2, . . . ). Next, a sample/hold transistor 92 (92-1, 92-2, . . . ) is turned on to transmit the signal to a vertical signal line 96 (96-1, 96-2, . . . ). Select pulses 505, 506, . . . are applied from a horizontal shift register 119 to horizontal select transistors 94 (94-1, 94-2, . . . ) to read out the signals of the selected row to a horizontal signal line 117.

A voltage signal read out to the horizontal signal line 117 is amplified by an output amplifier 120 and output to an A/D converter 121 at which the analog voltage signal is converted into a digital signal.

Since only one A/D converter 121 is used, it is required to perform a conversion operation at high speed. Problems of consumption power and noises are likely to occur. Since high speed conversion operation for outputs from a sensor having a number of pixels is required, its design becomes difficult.

FIG. 5 is a circuit diagram showing the outline of a conventional current output type CMOS sensor. In FIG. 5, reference numeral 131 represents a photodiode. An amplifying transistor 132 receives signal charges from the photodiode 131 and converts them into a current signal. Reference numeral 133 represents a reset switch, reference numeral 134 represents a sensor cell select switch, reference numeral 135 represents a horizontal select switch, and reference numeral 136 represents a fixed bias current source. A resistor 137 converts the signal current from the sensor cell into a voltage signal. A bias voltage source 139 determines a DC output level of an output amplifier 138.

Signal charges generated in the photodiode 131 are converted into a voltage by a capacitance of the gate of the amplifying transistor 132. In accordance with this converted voltage, the amplifying transistor 132 flows a drain signal current. When the switches 134 and 135 turn on, a difference between the current of the current source 136 and the output current of the amplifying transistor 132 appears at the resistor 137, and a voltage corresponding to this difference current appears at the output terminal of the output amplifier 138.

FIG. 6 is a circuit diagram showing the structure of an amplification type MOS solid state image pickup device of another current output type and its output read-out circuit. Reference numeral 1101 represents a photoelectric conversion unit. Signal charges generated in the photoelectric conversion unit 1101 are transmitted via a transfer transistor 1102 to the gate of an amplifying transistor 1103, and the signal charges are converted into a voltage signal at the gate. The amplifying transistor 1103 outputs a signal current Iout corresponding to the signal voltage to an output line via a pixel select transistor 1104. The output signal current is converted into a voltage by a resistor 1106 connected between the output terminal and inverting input terminal of a differential amplifier 1107. The converted voltage added to the voltage of a bias voltage source 1108 is output from the output terminal 1109. With the conventional circuits shown in FIGS. 5 and 6, as understood from the input voltage—output current characteristics of the amplifying transistor 1103 shown in FIG. 7, the output current is proportional to a square of an input voltage, and has the exponential characteristics of an input voltage equal to or smaller than the threshold voltage. The characteristics have therefore poor linearity and depend largely upon a temperature.

FIG. 8 is a circuit diagram of a conventional read circuit capable of suppressing noises caused by a manufacture variation of amplifying transistors 1103 of sensor cells. A current sample/hold circuit constituted of a switch 1108, a capacitor 1110 and a transistor 1112, holds an output current of an amplifying transistor 1103 in a reset state. Another current sample/hold circuit constituted of a switch 1109, a capacitor 1111 and a transistor 1113 holds a signal current output from the amplifying transistor 1103. The held currents are converted into voltages by current-voltage converter circuits 1116 and 1117, and a final output is obtained at an output terminal 1119 of a subtractor circuit 1118.

This conventional read circuit uses many transistors, switches, capacitors and amplifiers in order to suppress noises so that there are problems of a large consumption power and a large chip occupying area.

FIG. 9 is a circuit diagram in which a number of conventional photoelectric conversion units shown in FIG. 6 are disposed in parallel and image signals are output to common signal lines via pixel select switches. Signal charges in a photoelectric conversion element 201 (201-1, 201-2, . . . , 201-n) are converted into a voltage signal by the gate of an amplifying transistor 203 (203-1, 203-2, . . . , 203-n) and further converted into a current signal by the amplifying transistor 203. The current signal is output to a common signal line 209 via a pixel select transistor 204 (204-1, 204-2, . . . , 204-n), and again converted into a voltage signal by an amplifier 213 and a feedback resistor 212 to be thereafter output. Parasitic resistors r1 to rn of a wiring line from a high potential power source terminal are added between source terminals of the amplifying transistors. The more away from the power source terminal the pixel positions, the larger resistance as a sum of corresponding ones of r1 to rn the pixel has. Even if the amounts of signal charges in photoelectric conversion elements 201 of pixels are the same and these signal charges are converted into the same voltage signal at the gates of the amplifying transistors 203, the output currents of the amplifying transistors 203 of pixels become different because of different parasitic resistor values added to the source terminals. The output current becomes smaller at the pixel positioned away from the power source terminal. This is so-called shading phenomenon. This phenomenon becomes more conspicuous as the output current of the amplifying transistor becomes larger. Generally, the output current becomes larger as the amount of signal charges in the photoelectric conversion unit becomes larger. A precision of an output voltage is lowered by the parasitic resistor.

Each pixel select switch 204 has parasitic capacitance 206 (206-1, 206-2, . . . , 206-n) called gate/drain overlap capacitance and parasitic capacitance 207 (207-1, 207-2, . . . , 207-n) called drain/well PN junction capacitance. A total sum of such parasitic capacitance of a sensor having a number of pixels becomes large. This capacitance functions as a load capacitance of the amplifier 213 shown in FIG. 9 so that there are problems of lower slew-rate and unstable phenomenon such as ringing.

In the conventional circuits described above, in order to convert signal charges in a photodiode into a voltage signal and to amplify this voltage signal which is then A/D converted while noises are canceled, many switching transistors and capacitors such as a clamp capacitor and a sample/hold capacitor are required. Problems of a large chip occupying area and an increased cost therefore arise. When voltage signals from selected vertical signal lines supplied to the horizontal signal line are sequentially converted by one A/D converter, it is necessary to perform a conversion process at very high speed. For example, a conversion process time as very short as several tens ns per one pixel is required for a sensor compatible with HD (High Definition). An expensive and high speed A/D converter is therefore necessary.

In the current output type CMOS sensor, the relation between an output current (Io) of the amplifying transistor 132 and a voltage signal generated from signal charges in the photodiode 131 shows the square characteristics as indicated by the following equation, and shows the exponential characteristics in the range of a small voltage signal, so that the linearity is poor:

$$Io = K \cdot W/L (Vs - Vth)^2$$

where K is a constant, W and L are the gate width and length of the amplifying transistor 132, and Vth is a threshold voltage.

An image pickup device having an A/D converter provided for each pixel is disclosed in JP-A-6-205307. This image pickup device compares an integrated pixel voltage with a reference voltage by a comparator to obtain AD data.

An image pickup device having an A/D converter provided for each column is disclosed in ISSCC 99 Session 17, PAPER WA 17.7 A, 250 mW, 600 Frames/s, 1280 ×720 pixel 9b CMOS Digital Image Sensor. In this sensor, signals read out from each pixel column are compared with a reference voltage by a comparator to obtain digital data.

In the sensor disclosed in ISSCC 2000 Session 6, IMAGE Sensors PAPER MP 6.4 A 60 mW 10b CMOS Image Sensor with Column-to-Column FPN Reduction, a pixel signal is compared with a ramp signal to obtain AD data.

As above, in conventional circuits, a pixel signal is directly A/D converted or a pixel signal is A/D converted after it is amplified by an analog amplifier.

If a pixel signal picked up in the dark condition is to be directly A/D converted, a signal level is small relative to the rated input voltage of the A/D converter. Therefore, an S/N ratio becomes small and a quantization error of A/D conversion becomes large.

If a pixel signal is to be amplified by an analog amplifier to obtain large signal voltage, different amplification factors at respective columns generate vertical stripe noises on an image and the image quality is degraded considerably.

For a color image, the dynamic range of each color changes with a light source used for image pickup so that the full performance of an A/D converter cannot be utilized. For example, if the color temperature of a light source is low, a red pixel signal becomes large, whereas if the color temperature is high, a blue pixel signal becomes large, respectively limiting the input voltage to the A/D converter. The pixel size of an image pickup element is reducing year after year. If a pixel noise canceling circuit, an analog amplifier, a comparator, a D/A converter are to be provided for each column, the chip size becomes large. It is very difficult to design circuits to be disposed in the spaces between columns with the same circuit precision. These problems all result in vertical stripe noises on an image.

SUMMARY OF THE INVENTION

It is an object of the invention to provide a signal processing apparatus having an A/D converter capable of outputting a digital signal at a high precision.

In order to achieve the above object, one aspect of the invention provides a signal processing apparatus comprising: a plurality of circuit blocks each circuit block including a signal source and an output transistor adapted to receive a signal generated by the signal source at a control electrode region and outputting a corresponding signal from a main electrode region; and an analog/digital converter circuit adapted to sequentially process the signal from each of the plurality of circuit blocks, wherein the analog/digital converter circuit comprises a reference transistor for receiving a reference level at a control electrode region and outputting a corresponding signal from a main electrode region and a digital output circuit for outputting a digital signal in accordance with a signal output from the output transistor and a signal output from the reference transistor, and wherein the output transistor and reference transistor constitute an input unit of a differential amplifier circuit including the output transistor and reference transistor.

Another aspect of the invention provides a signal processing circuit comprising: a circuit block including a signal source and an output transistor adapted to receive a signal from the signal source at a control electrode region and output a corresponding signal from a first main electrode region; and an analog/digital converter circuit adapted to compare the signal output from the first control electrode region with a reference signal, control a level of a signal output from the first main electrode region of the output transistor in accordance with a comparison result, and output a digital signal in accordance with the comparison result.

Another aspect of the present invention provides a signal processing apparatus comprising: a plurality of pixels; and an analog/digital converter circuit adapted to output a digital signal in accordance with a comparison result between a level of a pixel signal from each of the pixels and a comparison reference level, wherein the analog/digital converter circuit changes relatively, within a variable range, the level of the pixel signal from each of the pixels and the comparison reference level, and changes the variable range.

In order to achieve the above object, another embodiment of the invention provides a signal processing apparatus comprising: a plurality of pixels disposed two-dimensionally; and a plurality of analog/digital converter circuits for converting signals output from the pixels into digital signals, wherein the plurality of analog/digital converter circuits are commonly provided for a plurality of columns.

Other objects and features of the present invention will become apparent from the following detailed description of embodiments when read in conjunction with the accompanying drawings.

DETAILED DESCRIPTION OF THE PREFERRED EMBODIMENTS

Figure 1:
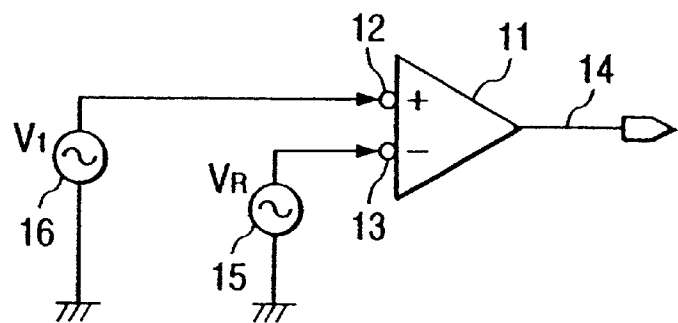
FIG. 1 is a diagram illustrating the fundamental technology of a conventional A/D converter.
Figure 2:
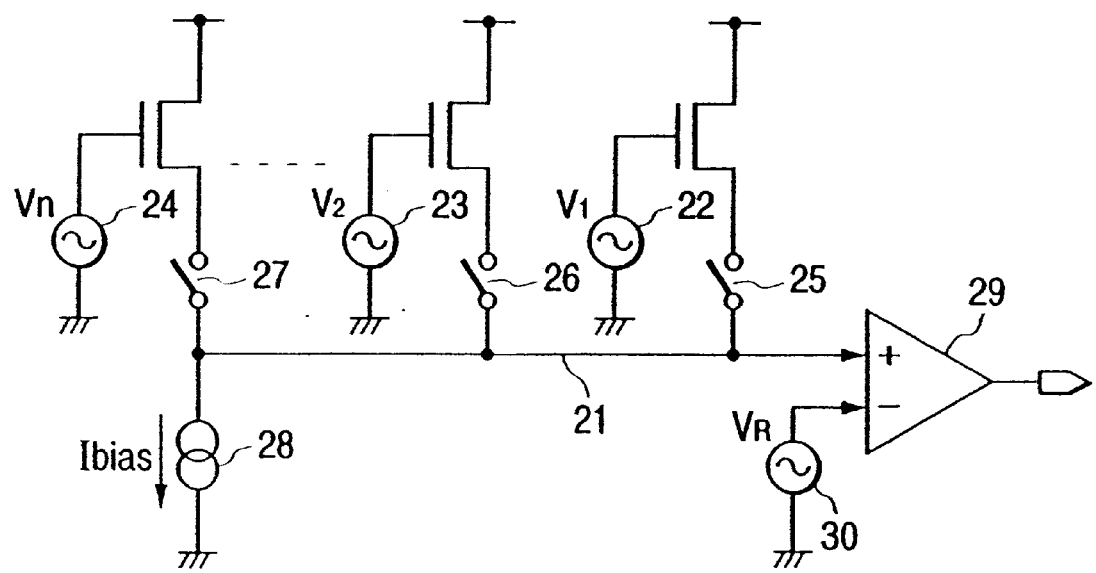
FIG. 2 is a diagram illustrating the fundamental technology of an A/D converter used for a column A/D type CMOS sensor.
Figure 3:
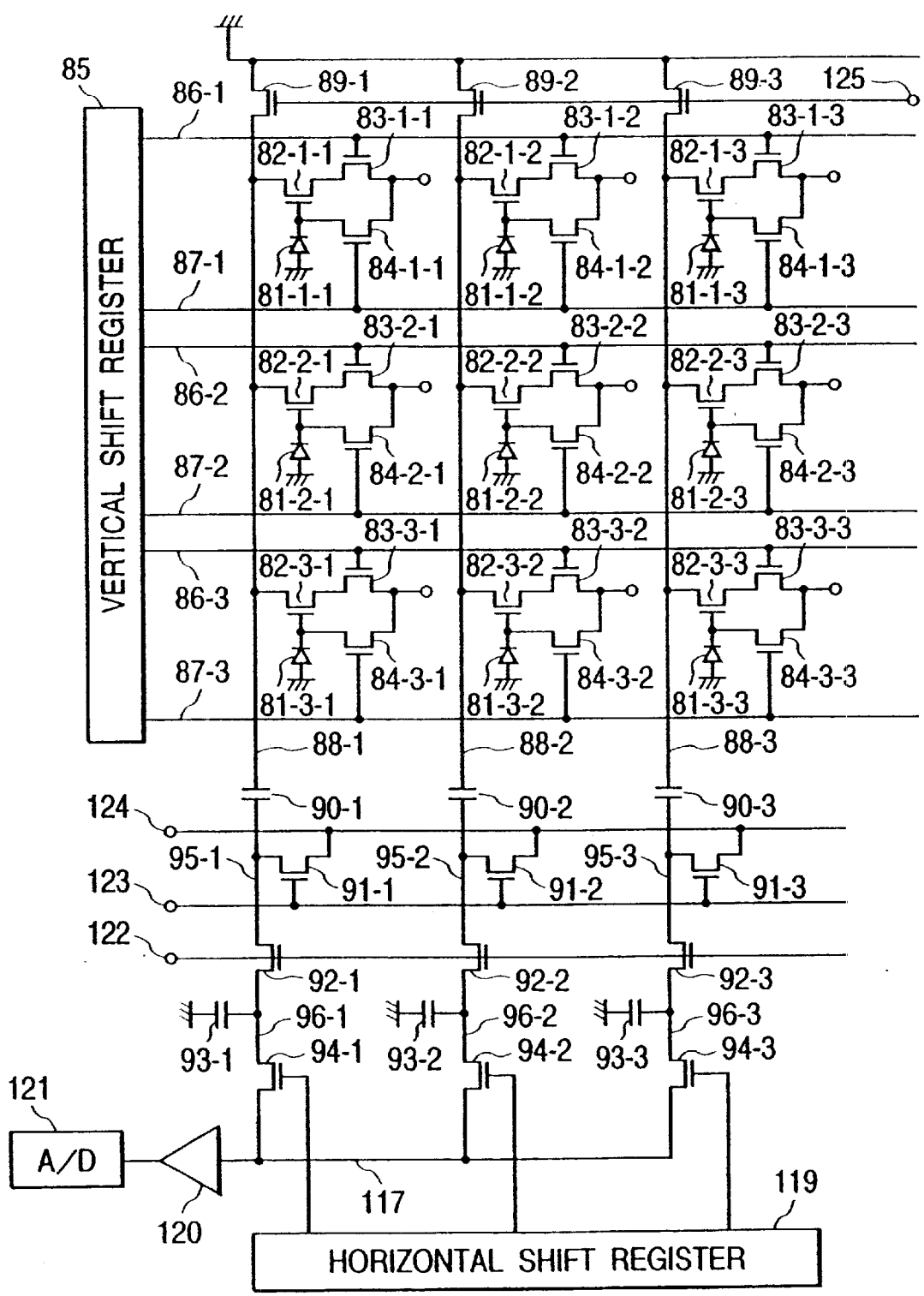
FIG. 3 is a circuit diagram showing the structures of a conventional MOS type solid state image pickup device and an A/D converter for A/D converting an analog signal output from the image pickup device into a digital signal.
Figure 4:
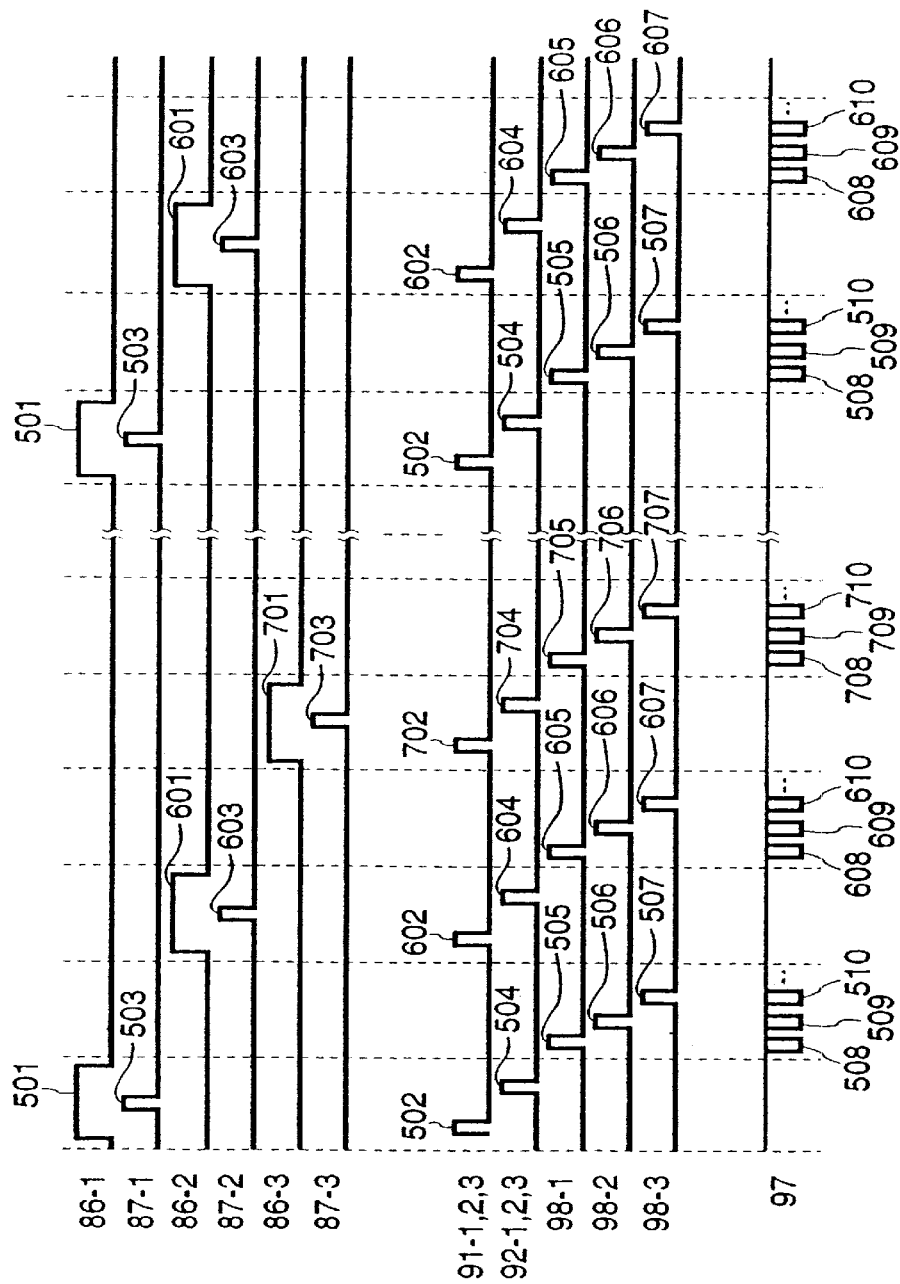
FIG. 4 is a timing chart illustrating drive timings of the circuit shown in FIG. 3.
Figure 5:
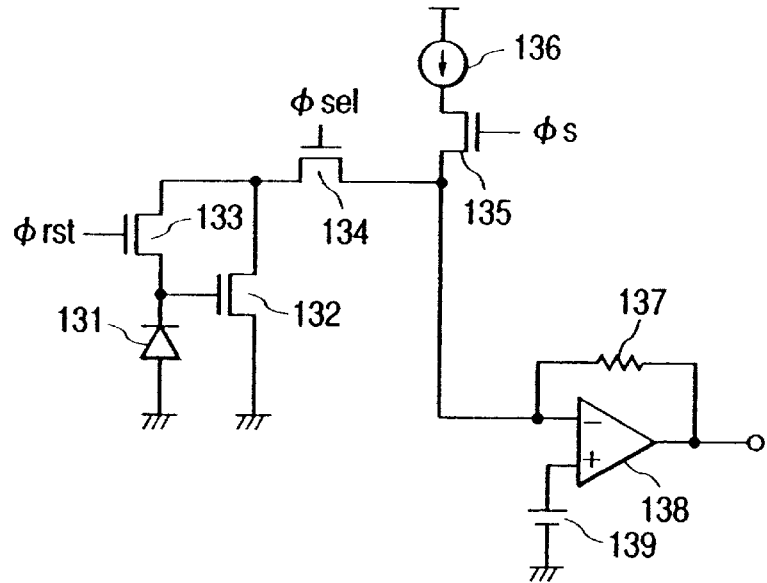
FIG. 5 is a circuit diagram showing the outline of a conventional current output type CMOS sensor.
Figure 6:
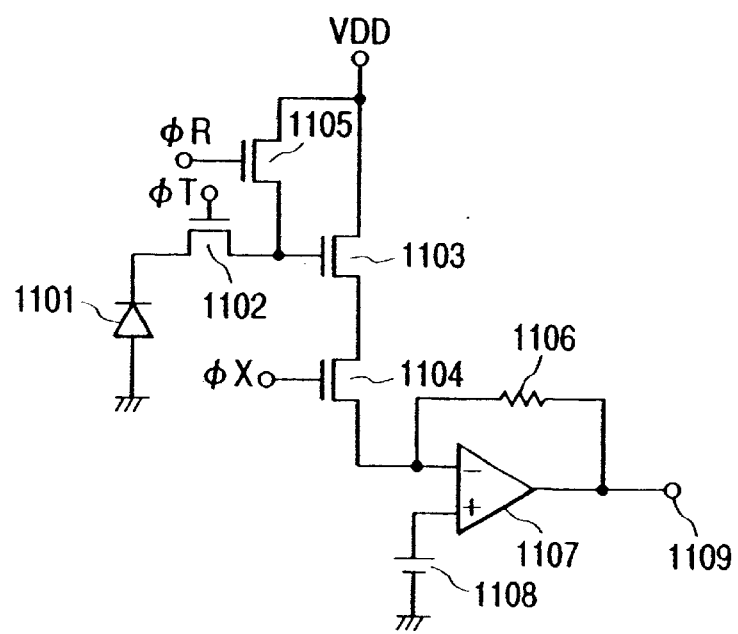
FIG. 6 is a circuit diagram of a conventional amplification type MOS solid state image pickup element and a read circuit for reading an output signal of the image pickup element.
Figure 7:
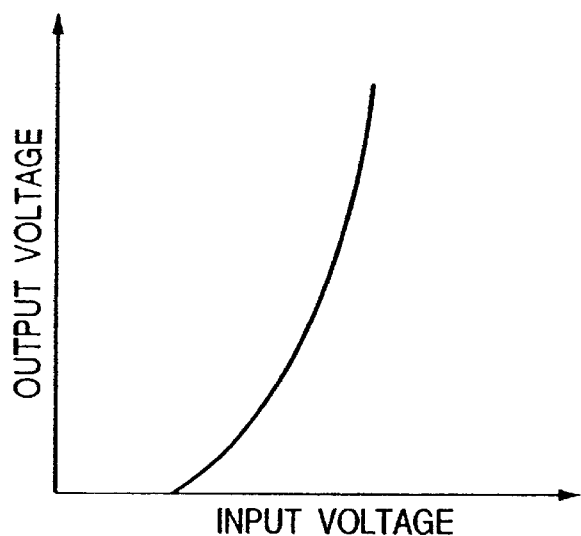
FIG. 7 is a graph showing the input voltage—output current characteristics of an amplifying transistor.
Figure 8:
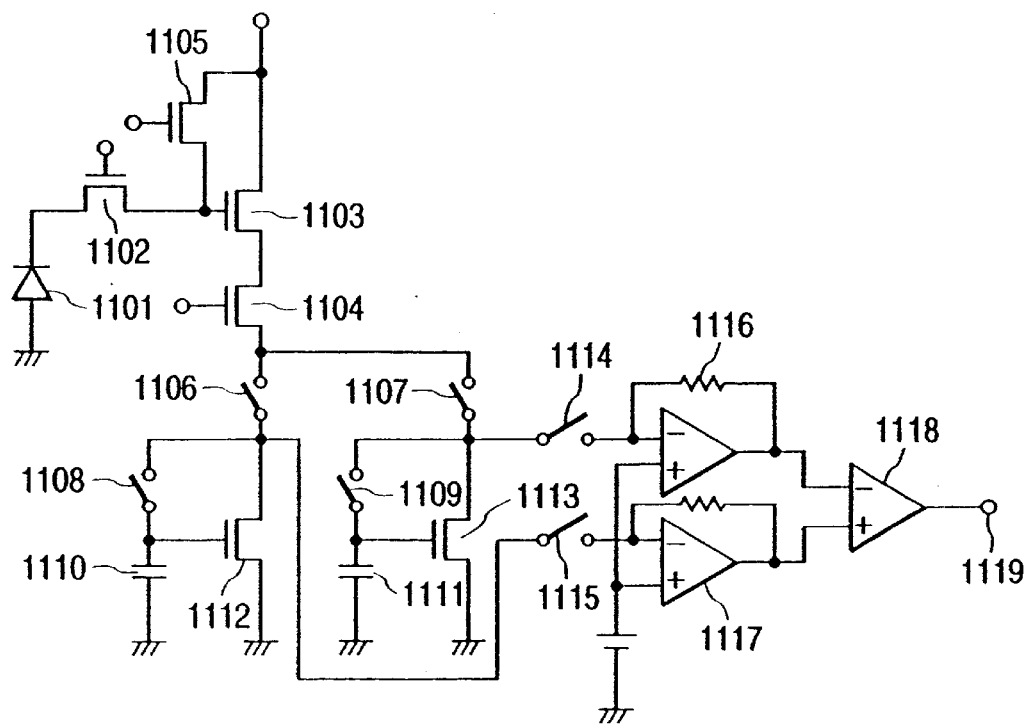
FIG. 8 is a circuit diagram of a conventional read circuit capable of suppressing noises to be generated by a manufacture variation in amplifying transistors of sensor cells.

Embodiments of the invention will be described in detail with reference to the accompanying drawings.

First, the concept of the first to sixth embodiments will be described with reference to FIG. 10.

Signal sources 101, 102 and 103 supply voltages. The signal source may be a photoelectric conversion element such as a photodiode, a Hall element, an magnetoelectric conversion element such as a magnetoresistive effect element, a semiconductor memory storing an electric signal, a piezoelectric element, a pressure sensor, an acceleration sensor or the like. The signal sources 101, 102 and 103 are connected to current paths 104, 105 and 106 which are controlled by voltage. The current paths 104, 105 and 106 connected in parallel can be selected by select switches 107, 108 and 109. A current path block 110 is constituted of the current paths 104, 105 and 106 and select switches 107, 108 and 109. A voltage source 111 for supplying a comparison reference voltage is provided and connected to a current path 112 which is also controlled by voltage.

The current path block 110 and current path 112 are connected to a comparator unit 113 which detects a difference between the current flowing through the current path block 110 and the current flowing through the current path 112 and compares the two current values. The comparator unit 113 outputs a comparison result from its output terminal 114.

The operation of this circuit will then be described. A value of the signal source 101, for example, is used for comparison.

In the current path block 110, only the select switch 107 is turned on. The current path block 110 is therefore controlled equivalently only by the signal source 101 and select switch 107.

In this state, the comparator unit 113 judges from a difference between currents of the current path block 110 and current path 112 whether which voltage of the signal source 101 and reference voltage source 111 is larger, and outputs a comparison result from the output terminal 114.

If a comparison result of another signal source among the signal sources 101, 102 and 103 is to be obtained, the corresponding select switch only is turned on.

Figure 10:
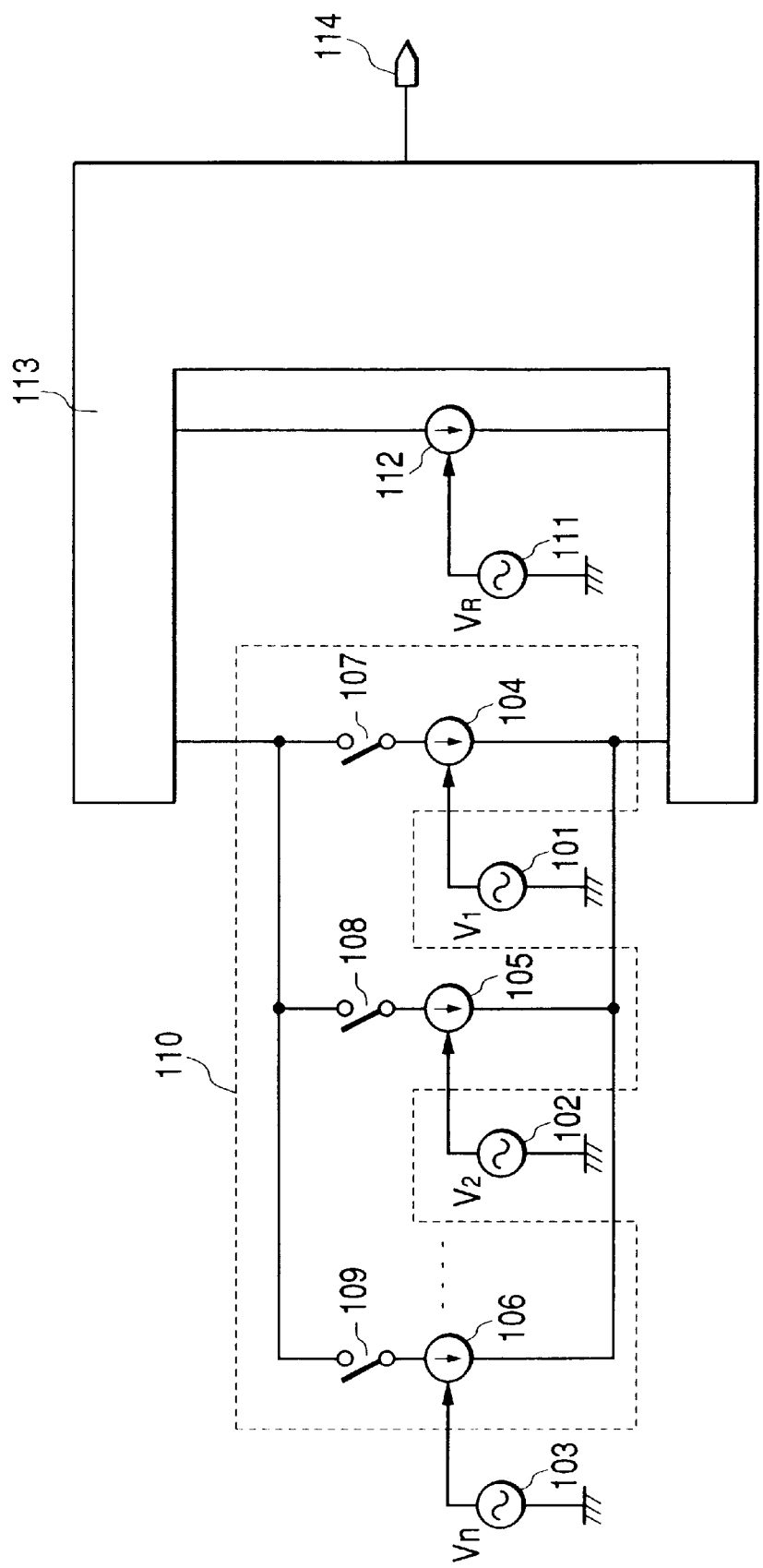
FIG. 10 is a schematic circuit diagram showing the structure of a comparator according to an embodiment of the invention.

Although three signal sources are used in FIG. 10, the number of signal sources is not limited to three, but a desired number of signal sources can be used. The number of signal sources depends on design parameters such as an operation speed of the circuits, a circuit area, and specifications.

An advantageous point of this embodiment as compared to a conventional circuit is that voltages are directly input to the comparator unit without using source followers. The amount of current necessary for source followers is not necessary.

A variation in offsets or gains of comparator units depends on a variation in characteristics of the current paths 104, 105 and 106 of the pixels relative to the characteristics of the current path 112.

A difference between the variations of this embodiment circuit and a convention circuit is as follows. With a conventional circuit, the variation includes a "variation in gains of pixels" and a "variation in gains of comparator units", whereas with the embodiment circuit, the variation includes only a "variation in gains of pixels". According to the present invention, the "variation in gains of comparator units" can be eliminated.

Specific circuit structures of the embodiments will be described.

Figure 11:
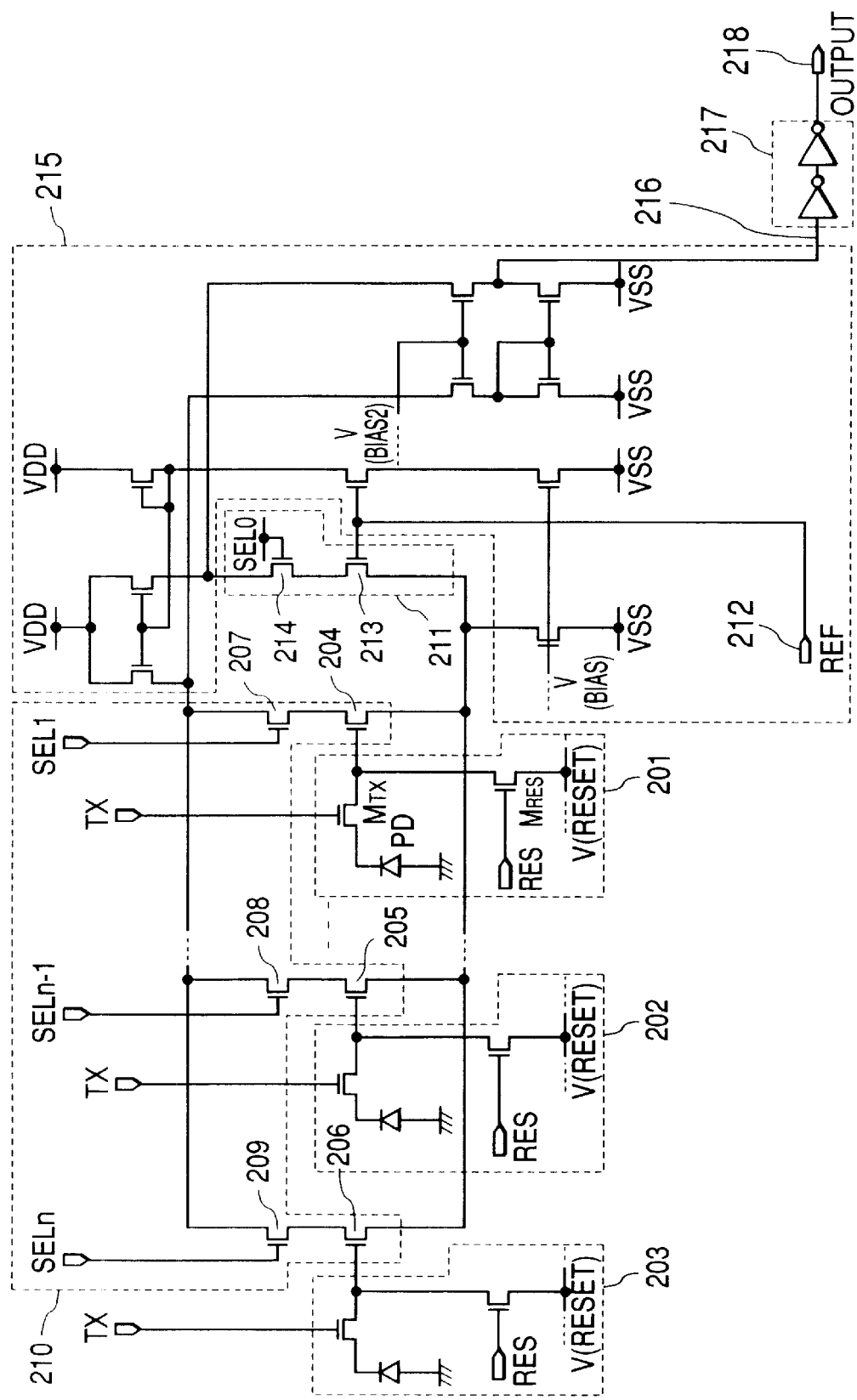
FIG. 11 is a schematic circuit diagram showing a solid image pickup element using a compartor according to an embodiment of the invention.

The first embodiment of the invention will be described with reference to FIG. 11. In FIG. 11, one comparator is used for three pixels 201, 202 and 203. Pixels may be disposed in the horizontal and vertical directions and a comparator may be provided for each column in the vertical direction.

Each of signal sources 201, 202 and 203 is constituted of a photoelectric conversion unit including a photodiode PD (photoelectric conversion element), a transfer switch MTX and a reset switch MRES. Current paths controlled by voltage are made of MOS transistors 204, 205 and 206, and select switches are made of MOS transistors 207, 208 and 209. These MOS transistors constitute a current path block 210. One pixel is constituted of one current path and one signal source. Another current path 211 is constituted of a reference voltage input terminal 212, a MOS transistor 213 as a current path controlled by voltage, and a select switch 214 which is a dummy switch always turned on.

The photodiode may be a complete depletion type PIN photodiode which is not influenced by random noises generated during resetting, a PN type photodiode, or a photogate made of a transistor capable of performing both photoelectric conversion and amplification.

The comparator unit 215 is made of an operational amplifier using as inputs a differential pair of current path block 210 and current path 211. In this embodiment, a folded cascade current mirror type operational amplifier is used. An output 216 of the comparator unit 215 constituted of the operational amplifier is amplified by a high gain buffer 217 and a comparison result is output from an output terminal 218.

The operation of the circuit will be described by taking as an example the comparison between the reference voltage and photoelectric conversion unit 201. Only the select switch 207 is turned on to constitute an operational amplifier using a differential pair of the current paths 204 and 211. Since the operational amplifier has a very high gain, the comparison is performed by outputting a high level or low level as the output 216 in accordance with a difference between the voltage output from the photoelectric conversion unit 201 and the voltage applied to the reference voltage input terminal 212.

In this embodiment, although the comparator unit 215 uses an operational amplifier which is equivalently a folded cascade current mirror type, other types such as a type using a differential amplifier and a high gain amplifier may also be used. If an open loop gain of the operational amplifier is insufficient and the comparison cannot be performed reliably, the gain of the buffer 217 is increased further.

In this embodiment, although n-type MOS transistors are used for the differential amplifier input stage of the differential amplifier, p-type MOS transistors may also be used. Also in this embodiment, the pixel has the grounded anode of the photodiode and an n-type transfer MOS transistor is used. Instead, for example, a pin diode may be formed in an n-well to ground the cathode and a p-type transfer MOS transistor may be used. Also in this embodiment, although the transfer MOS transistors MTX and reset MOS transistors of the photoelectric conversion units 201, 202 and 203 and MOS transistors 204, 205 and 206 are all n-type MOS transistors, they are not limited only to all n-type MOS transistors. For example, the MOS transistors 204, 205 and 206 may be p-types and the MOS transistor constituting the pixel may be an n-type, or vice versa.

The select switch 214 as a dummy always turned on is provided from the following reason. If the switch is not provided in the current path 211 although the switches are provided in the current path block 210, currents flowing through the current path block 210 and current path 211 are unbalanced and an offset is generated during current comparison. The size of the switch 214 is generally made equal to that of the switch 207. If the process after the current comparison is performed by taking the offset during current comparison into consideration, the size of the select switch 214 may not be equal to that of the switch 207, or the select switch 214 may be omitted.

Advantage of this embodiment as compared to a conventional circuit is that voltages are directly input to the comparator unit without using source followers. The amount of current necessary for source followers can be omitted. The current can be reduced for comparators used for a CMOS sensor having a number of pixels disposed in columns.

Another advantage point of this embodiment as compared to a conventional circuit is that a variation in gains of A/D converters can be eliminated.

The conventional structure of pixels and A/D converters with a source follower structure has both a "variation in gains of source followers caused by a variation in gm and rds" and a "variation in gains of A/D converters". The variation particularly in gains of A/D converters causes vertical stripes on an image. In this embodiment, a variation is formed by a difference of characteristics between the MOS transistors 204, 205 and 206 and the MOS transistor 213, which variation corresponds to the "variation in gains of source followers caused by a variation in gm and rds". The influence degree of this variation can be practically accepted.

In this embodiment, the conventional problem of the "variation in gains of A/D converters" of each column can be eliminated. The effects of this embodiment can be obtained commonly in the second to sixth embodiments.

In order to remove noises, a noise removing process is generally performed in which a pixel output during resetting is once stored and this output is subtracted from a pixel output after photoelectric conversion. Such noises include pixel reset noises and pixel fixed pattern noises. The pixel reset noises are typically generated during correlation double sampling (CDS) of a CCD or during resetting of an active pixel sensor such as a CMOS image sensor. If the noise removing process and an A/D conversion process are to be combined, generally, after the noise removing process is performed at an analog signal level, the A/D conversion process is performed.

In this embodiment, the value after A/D conversion is subtracted so that the effects similar to CDS or the like can be obtained.

Figure 12:
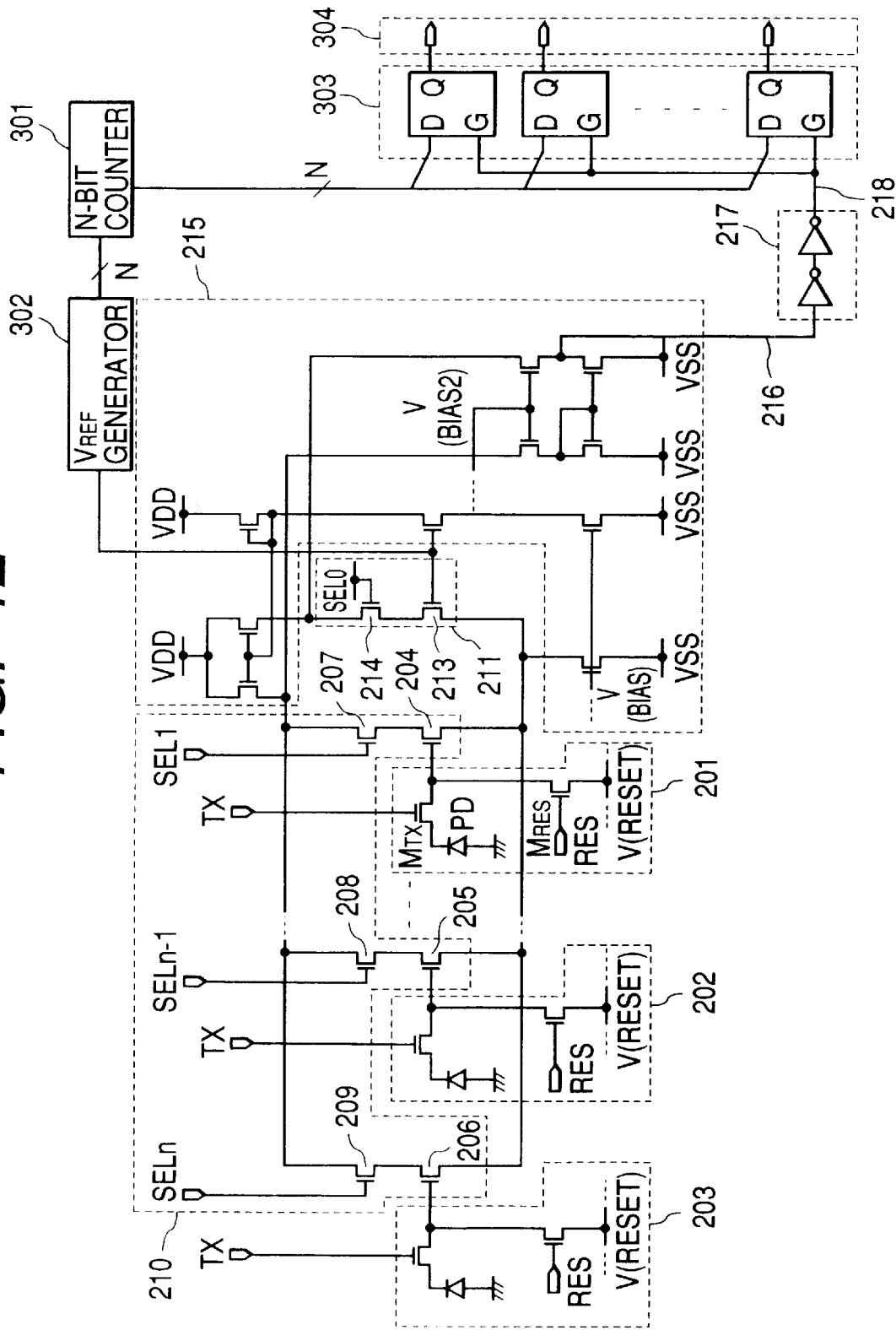
FIG. 12 is a schematic circuit diagram showing a solid image pickup element using an A/D converter according to an embodiment of the invention.

The second embodiment of the invention will be described with reference to FIG. 12. In the second embodiment of the invention, the A/D converter is configured by using the compartor described with the first embodiment. In FIG. 12, like elements to those shown in FIG. 11 are represented by identical reference numerals and symbols. Referring to FIG. 12, an N-bit binary counter 301 counts up from 0 to ($2^N$-1). This count is input to a $V_{REF}$ generator (reference voltage generator) 302 which generates a reference voltage corresponding to the count. This operation is illustrated in FIGS. 13A and 13B.

Figure 13A:
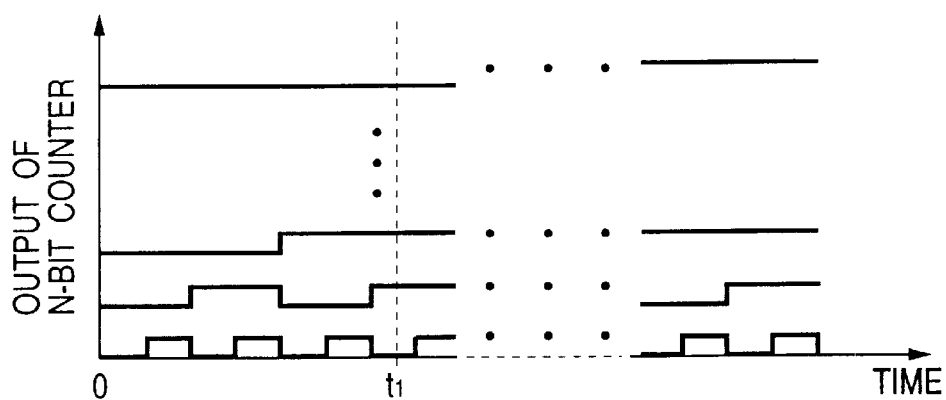
FIGS. 13A, 13B and 13C are timing charts illustrating the operation of the solid state image pickup element shown in FIG. 12.
Figure 13B:
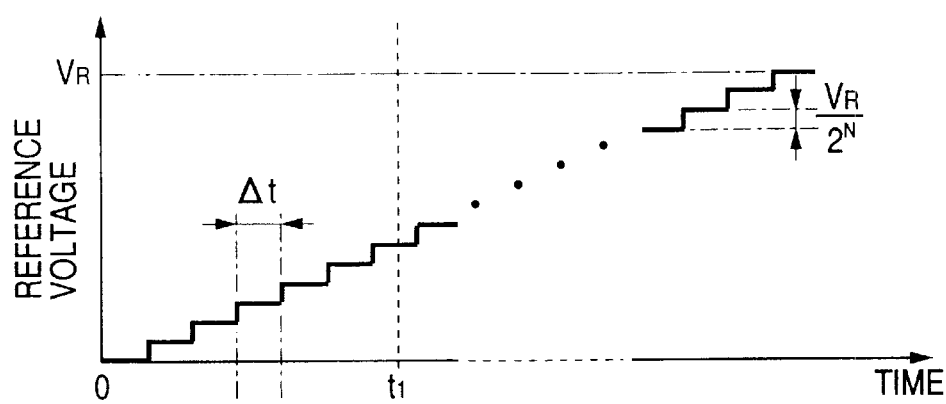

In FIG. 13A, the abscissa represents time, and the ordinate represents a count of the binary counter, the lower side starting from LSB and the upper side ending at MSB. FIG. 13B shows the reference voltage in an analog value.

The reference voltage changes stepwise at a constant increment factor of $VR/(2^N)$ per one step having an amplitude of VR (the reference voltage monotonously increases, i.e., a differential value relative to time is always positive during each A/D conversion process). A reference voltage at the time when the count takes a value K is represented by:

$$K \times VR/(2^N).$$

A comparator output 218 is supplied to each gate terminal of N-bit D-type latches 303. N determines the resolution of the A/D converter of this embodiment. A bit value of each digit of the counter is input to the data input terminal of each latch.

The circuit operation will be described. Only the pixel to be A/D converted is selected similar to the comparison operation. For example, if the photoelectric conversion unit 201 is to be selected, the select switch 207 is turned on.

Figure 13C:
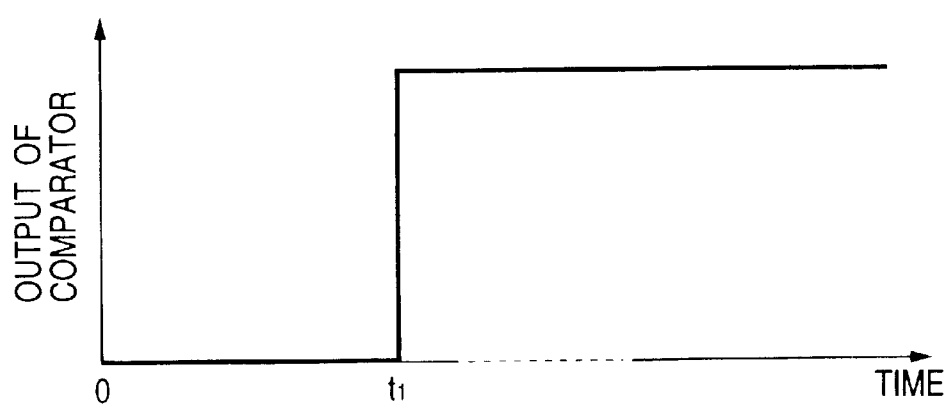

FIG. 13C shows a compartor output. Time 0 shown in FIG. 13C corresponds to the time when accumulation operation is completed. The reference voltage increases starting at time 0. It is assumed that the voltage at the photoelectric conversion unit 201 is the same as the reference voltage at time t1 when the comparator output inverts. At this time, this comparator output signal is applied to the gates of the D-type latches 303 so that the counts supplied to the D-type latches are stored in the latches. The values stored in the D-type latches are binary signals corresponding to the reference voltage, i.e., A/D conversion result, and are output to output terminals 304 of the latches. In this manner, A/D conversion can be realized.

Although the reference voltage is increased relative to time, it may be decreased (monotonous decrease, i.e., a differential value relative to time is always negative). In this case, the protocol for A/D conversion result is changed correspondingly.

The compartor performs a comparison operation stating at time 0. In order to obtain correct A/D conversion, it is required not to change the pixel value during the comparison operation. To this end, as in the embodiment circuit structure, an output from the photodiode is supplied via the transfer switch MTX to the control terminal of the current path, a mechanical shutter is used instead of applying the photodiode output to the control terminal of the current path, or other countermeasures are performed.

The amplitude of change of the reference voltage per one step shown in FIG. 13B is not necessarily set to $VR/(2^N)$. If the quantization error during the range from the reference voltage of 0 to VR is made equal, i.e., if the same weight is used for noises during A/D conversion, it is necessary to set the amplitude to $VR/(2^2)$. Essentially, it is required to make the accumulated values of the reference voltage of all steps, equal to VR. In the image sensor, when applications thereof are taken into consideration, it is not always necessary to perform A/D conversion at the constant weight over the whole steps. The image quality may be improved at a low resolution N by roughly quantizing the voltage obtained at a large incidence light amount and finely quantizing the voltage obtained at a small incidence light amount. In this case, the change of the reference voltage may be increased with time or it may be decreased with time.

Figure 14:
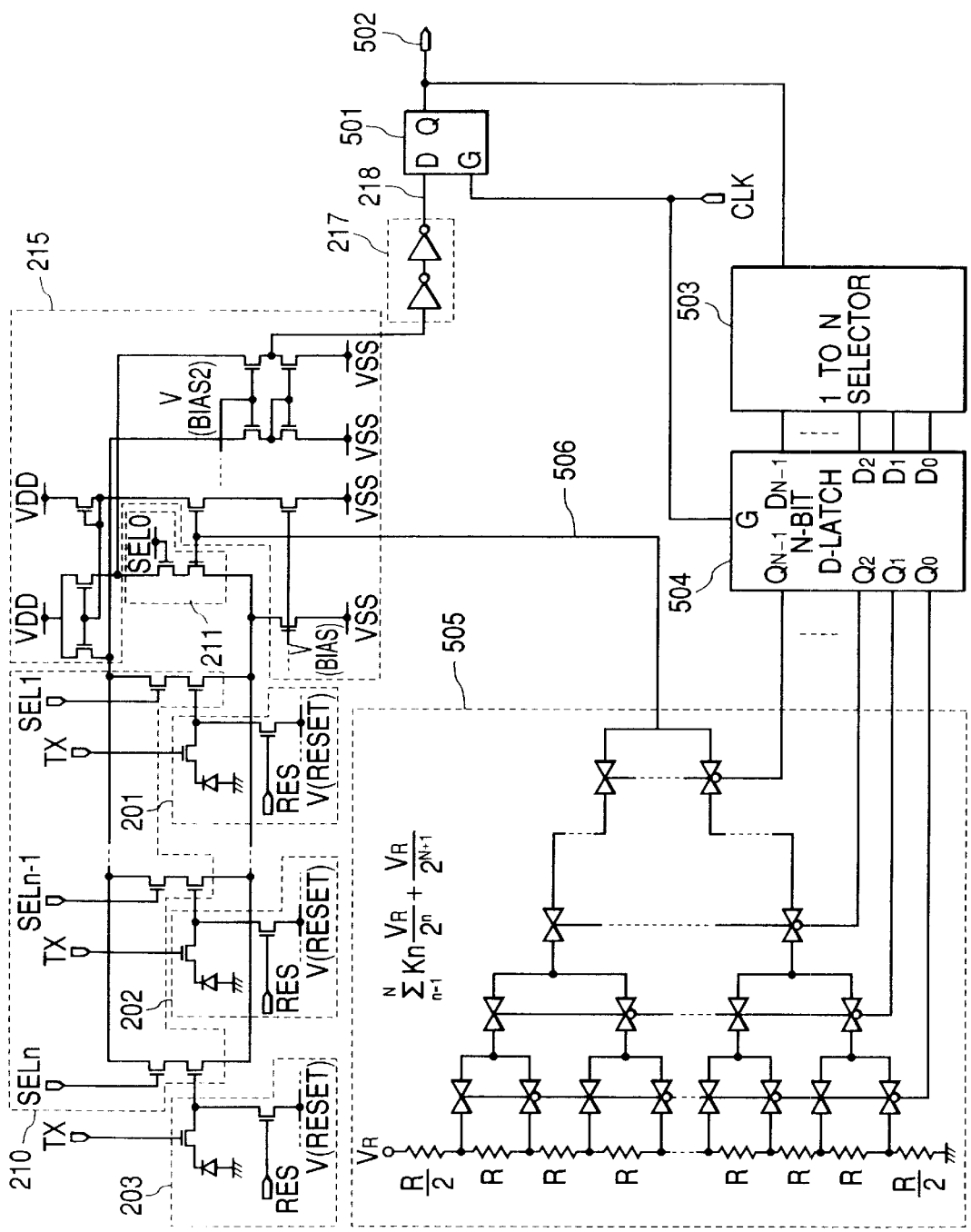
FIG. 14 is a schematic circuit diagram showing a solid image pickup element using an A/D converter according to another embodiment of the invention.

The third embodiment of the invention will be described with reference to FIG. 14. In the third embodiment of the invention, the A/D converter is configured by using the compartor described with the first embodiment. The structure of the comparator is similar to that of the first embodiment. In FIG. 14, like elements to those shown in FIG. 11 are represented by identical reference numerals and symbols (some reference numerals are omitted for the purposes of drawing simplicity). A different point from the second embodiment is an algorithm for generating the reference voltage. In the second embodiment, it is necessary to perform the comparison operations ($2^N$) times at a maximum for the establishment of a comparison result. In contrast, in this embodiment, since the sequential comparison scheme is used, N comparison operations are performed for the establishment of a comparison result so that high speed A/D conversion is possible.

A compartor output 218 is output via a sync latch 501 as an A/D converter output 502. This A/D comparator output 502 is supplied to an N-bit D-type latch 504 via a 1-N selector 503. The D-type latch 504 controls switches of a reference voltage generator 505. The reference voltage generator 505 outputs a $V_{REF}$ output 506 having a value of:

$$\sum_{n=1}^{N} K_N(V_R/2^N) + (V_R/2^{N+1})$$

where the value of K1, K2, ... KN corresponds to logical 0 or 1 of Q0, Q1, ... QN-1 of the D-type latch.

Next, the circuit operation will be described by taking as an example the A/D conversion of a pixel value of the photoelectric conversion unit 201. It is assumed that N=3 bits and the pixel value of the photoelectric conversion unit 201 corresponds to the sixth order in eight tonal levels (=(5/8)VR).

(Q2, Q1, Q0) is given beforehand (1, 0, 0), and the $V_{REF}$ output 506 is:

$V_{REF}=(VR/2)+(VR/16)$

The pixel value of the photoelectric conversion unit 201 is larger than the $V_{REF}$ value so that the comparator outputs a level "1". Next, (Q2, Q1, Q0) is given (1, 1, 0). "1" of Q2 is a value determined at the preceding comparison operation. The $V_{REF}$ output 506 is given by:

$V_{REF}=((6/8)VR)+(VR/16)$

This value is smaller than the pixel value of the photoelectric conversion unit 201 so that the comparator outputs a level "0". This value is written in Q1 via the selector 503.

Next, (Q2, Q1, Q0) is given (1, 0, 1). The $V_{REF}$ output 506 is given by:

$V_{REF}=((5/8)VR)+(VR/16)$

This value is larger than the pixel value of the photoelectric conversion unit 201 so that the comparator outputs a level "1". This value is written in Q0 via the selector 503.

A result held in the latch is an A/D conversion result whose value is therefore read out. Time sequential A/D conversion outputs 502 correspond to a serial output of the A/D conversion result starting from the upper bit. Therefore, the result may be read out at any time without waiting for the completion of the A/D conversion.

As above, the A/D converter apparatus with reduced current can be realized. The structure of the reference voltage generator 505 is not limited only to serially connected resistors. For example, capacitors disposed in parallel may be used or other structures may also be used.

In the second and third embodiments, A/D converters of two types are used. A/D converters of other types may also be used if the circuit structure uses one comparator.

Figure 15:
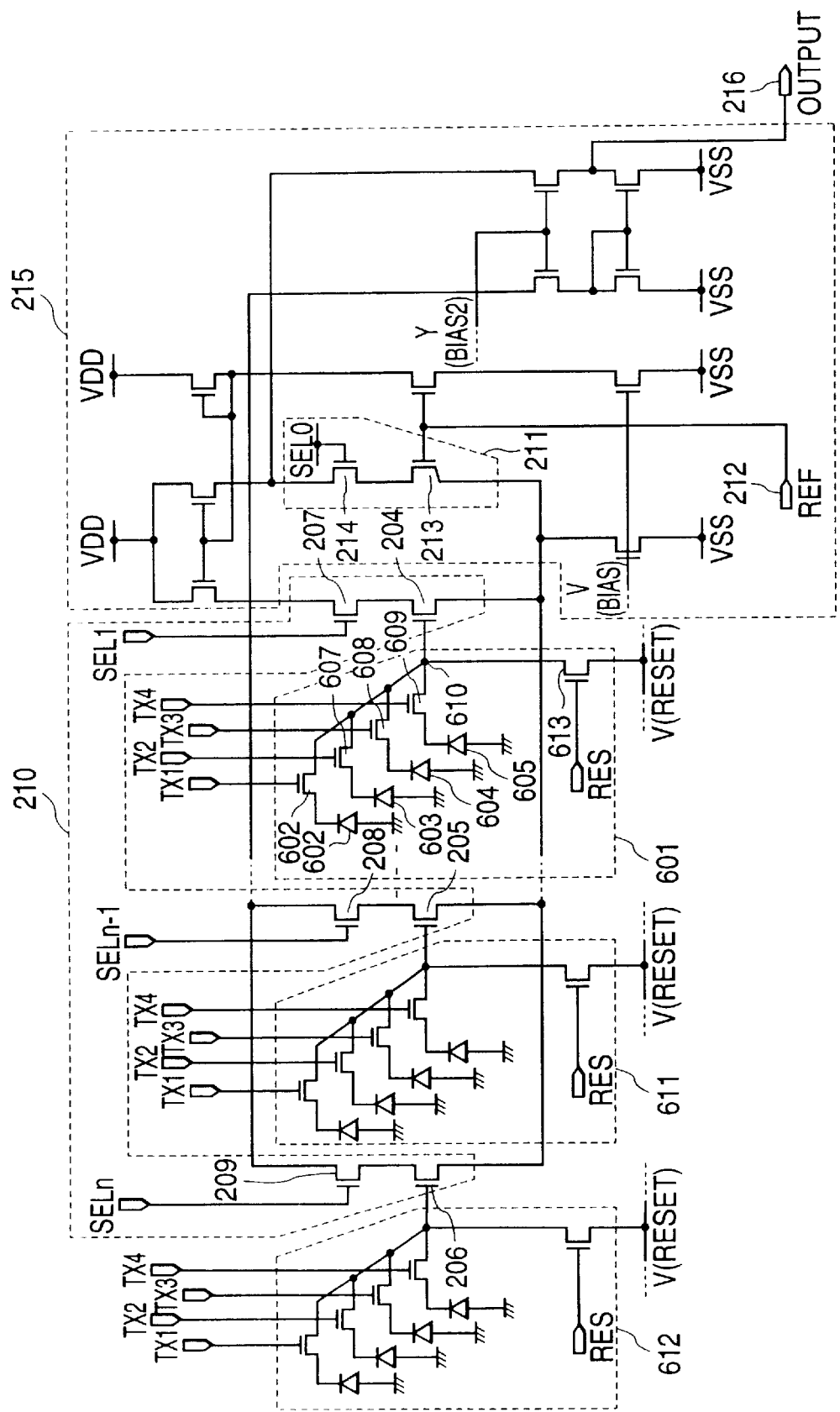
FIG. 15 is a schematic circuit diagram showing a solid image pickup element using an A/D converter according to another embodiment of the invention.

The fourth embodiment of the invention will be described with reference to FIG. 15. The fourth embodiment of the invention aims at reducing the number of components per pixel. The circuit diagram of the comparator only is shown and the peripheral circuits necessary for A/D conversion are omitted. The operation principle of A/D conversion is similar to that of the second and third embodiments.

In a photoelectric conversion unit 601, photodiodes 602, 603, 604 and 605 are controlled by transfer switches 606, 607, 608 and 609 to transfer charges accumulated in one or more photodiodes to a floating diffusion 610 which functions as a charge/voltage converting unit. A reset switch 613 resets the floating diffusion 610. Photoelectric conversion units 611 and 612 having the structure similar to that of the photoelectric conversion unit 601 are disposed in parallel to constitute signal sources.

The operation principle is similar to that of the first embodiment. Switches 207, 208 and 209 are selectively turned on to compare currents of the current paths 210 and 211 to thereby perform A/D conversion.

As compared to the above-described embodiments, in the fourth embodiment, a set of a plurality of photodiodes and the transfer switch commonly use one reset switch (e.g, 613), one current path MOS transistor (e.g., 204) and one select MOS transistor (e.g., 207). The number of components constituting a pixel can therefore be reduced.

Figure 16:
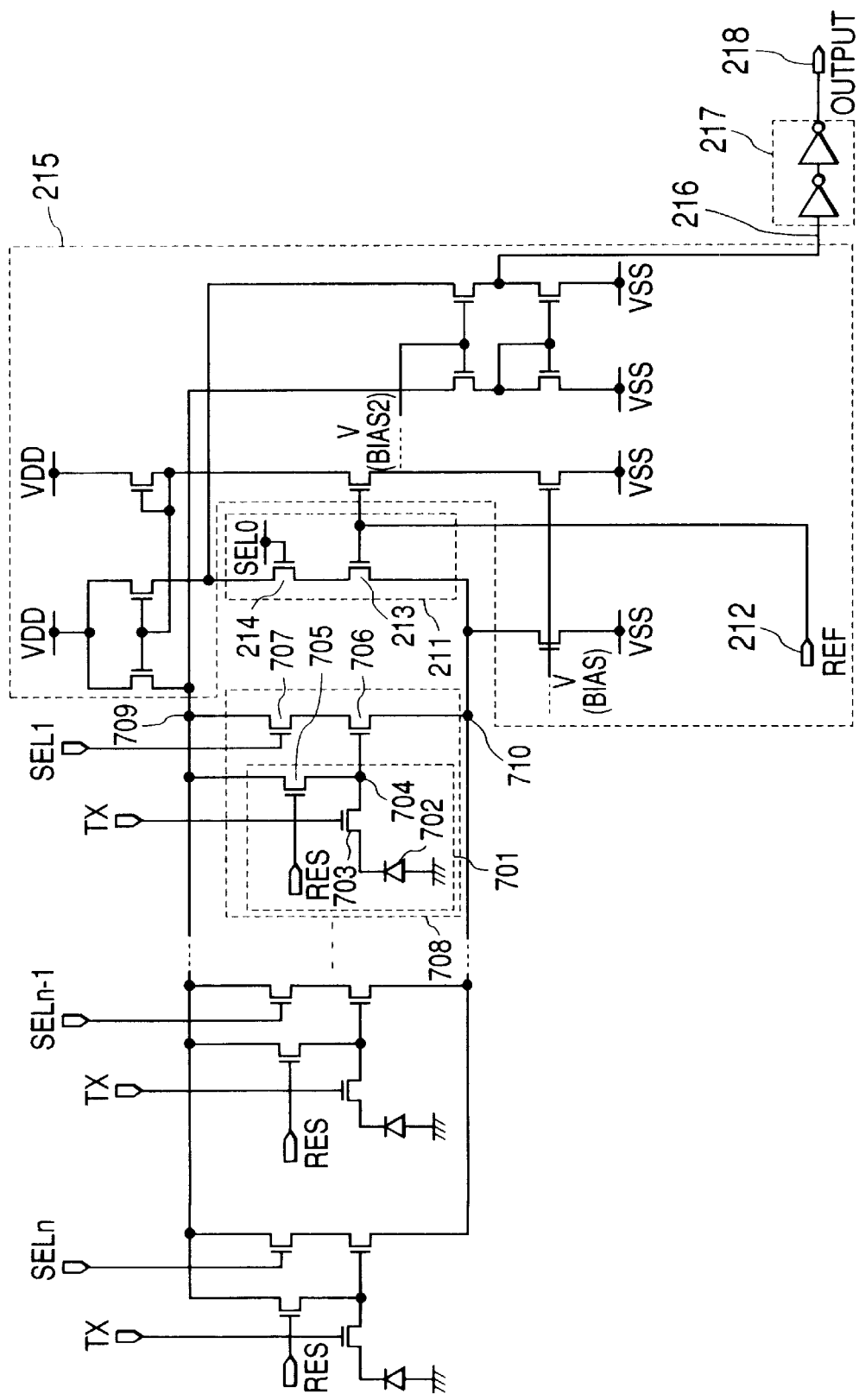
FIG. 16 is a schematic circuit diagram showing a solid image pickup element using a comparator according to another embodiment of the invention.

The fifth embodiment of the invention will be described with reference to FIG. 16. In FIG. 16, like elements to those shown in FIG. 11 are represented identical reference numerals and symbols.

A photoelectric conversion unit 701 is constituted of a photodiode 702, a transfer switch 703, a floating diffusion 704, and a reset switch 705. The floating diffusion 704 is connected to a MOS transistor 706 forming a current path and to a select transistor 707. The MOS transistors 706 and 707 are used by one pixel 701. These are collectively called a pixel 708.

In the first to fourth embodiments, the reset switch is independently connected to a reset voltage supply terminal. In this embodiment, the reset switch is connected to the drain terminal 709 of the select transistor 707.

When applications of an image sensor are taken into consideration, it is important to reduce the number of components per pixel and the wiring area occupying ratio to thereby improve the characteristics such as an aperture ratio and other parameters. In the first to fourth embodiments, wirings to the terminals 709 and 710 necessary for each pixel as well as the terminal for reset voltage supply are required. In the comparator of this embodiment, the terminal 709 is used also as the reset voltage supply terminal so that the wiring area occupying ratio of each pixel can be reduced and the image sensor characteristics can be improved.

In the first to fifth embodiments, A/D conversion is performed by using as a comparator the operational amplifier without feedback as seen from the equivalent circuit viewpoint. Such a comparison operation will be described with reference to FIG. 17.

Figure 17:
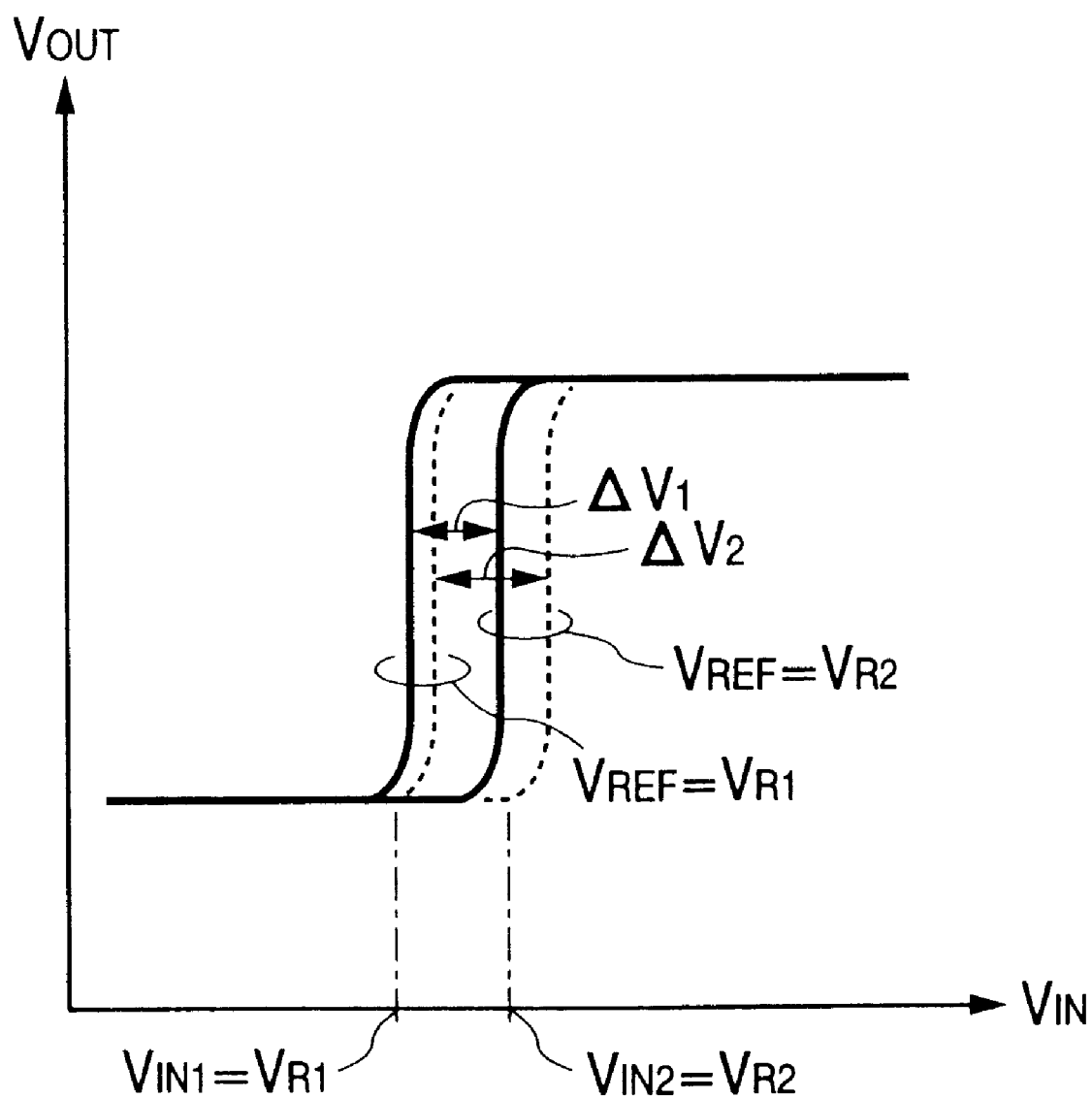
FIG. 17 is a graph illustrating a comparison operation of a comparator without feedback.

FIG. 17 is a graph showing the dependency upon $V_{REF}$. The abscissa represents a voltage $V_{IN}$ to be converted, and the ordinate represents a voltage $V_{OUT}$ output from an output terminal 216 as a comparison result. As the voltage at $V_{REF}$ is changed, the input/output characteristics change so that the inversion threshold value changes and A/D conversion becomes possible. However, there is a difference from the ideal inversion.

For example, if there is a variation in mutual conductances of the current paths 204 and 205 shown in FIG. 11 because of manufacture process variation, the input/output characteristics become those shown in FIG. 17 by a solid line and a broken line. As $V_{REF}$ is changed from $V_{R1}$ to $V_{R2}$, the change amount of the threshold value is ideally:

$$\Delta V = V_{R1} - V_{R2}$$

However, because of a variation in mutual conductances or the like, there is a variation in the threshold value change amounts such as $\Delta V1$ and $\Delta V2$ shown in FIG. 17. This variation appears as a differential non-linear error of the A/D converter or a sensitivity difference of pixels if the A/D converter is used as the photoelectric conversion unit.

Figure 18:
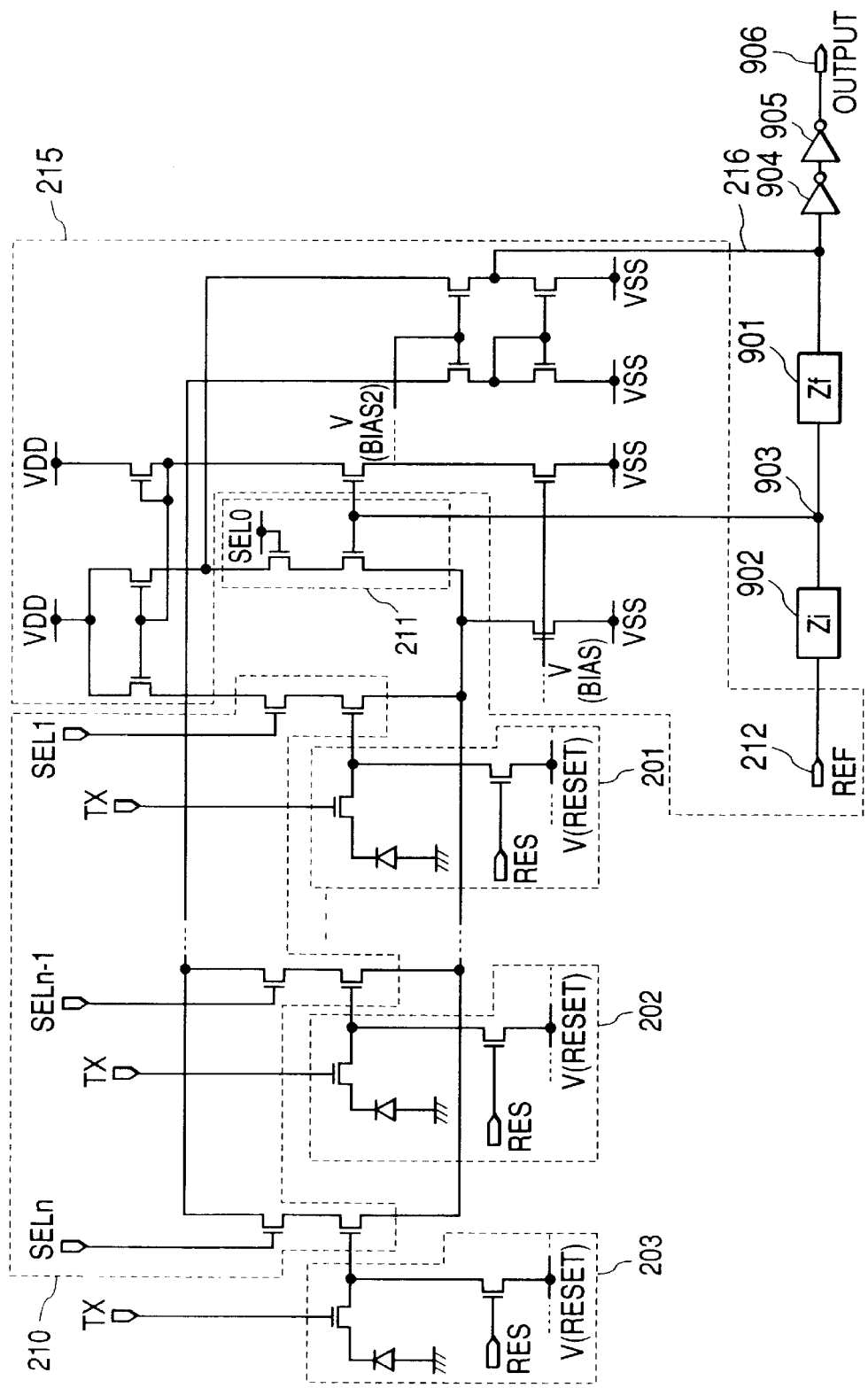
FIG. 18 is a schematic circuit diagram showing a solid image pickup element using a comparator without feedback according to an embodiment of the invention.

This problem is solved by the comparator of the sixth embodiment of the invention. The sixth embodiment of the invention will be described with reference to FIG. 18. In FIG. 18, like elements to those shown in FIG. 11 are represented by identical reference numerals and symbols (some reference numerals are omitted for the purposes of drawing simplicity). In this embodiment, an equivalent output of the operational amplifier, i.e., a terminal 216, is connected via a load Zf 901 to the inverting input terminal 903 of the comparator, and a load Zi 902 is connected between the reference voltage input terminal 212 and an input terminal 903.

A negative feedback at a feedback ratio $\beta = Z1/(Zi + Zf)$ is realized. Inverters 904 and 905 are inserted between the terminal 216 and the real output terminal 906 of the comparator to realize discrete comparison with high gain.

Figure 20:
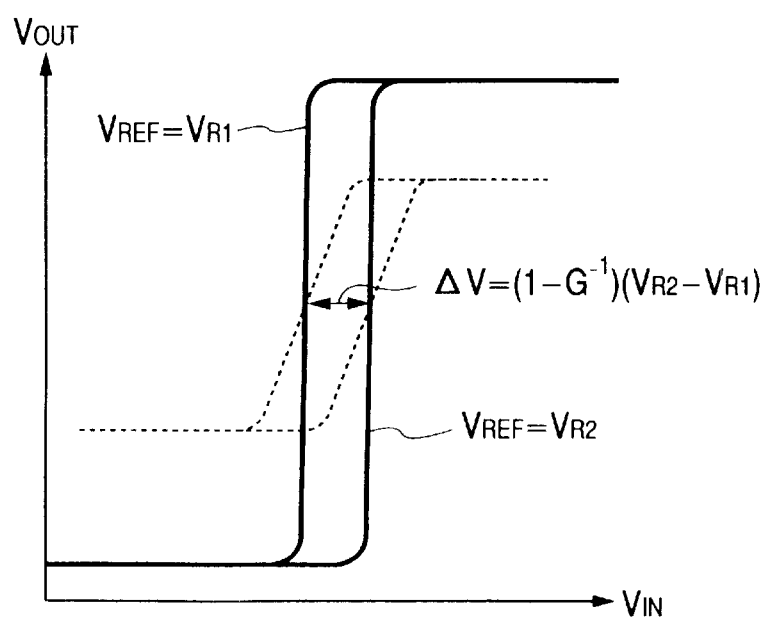
FIG. 20 is a graph showing the comparison operation of a comparator using negative feedback.

The technological effects of this embodiment will be described. With the negative feedback shown in FIG. 18, the input/output characteristics of the comparator become as shown in FIG. 20. The input is, for example, a voltage supplied from the photoelectric conversion element and the output is a voltage at the terminal 216. G is a gain of the comparator, where $G = 1/\beta$. As VR is changed from $V_{R1}$ to $V_{R2}$, although the input/output characteristics change, the change width $\Delta V$ is given by:

$$\Delta V = (1 - 1/G)(V_{R2} - V_{R1})$$

Therefore, $\Delta V$ is not dependent upon gm or the like (assuming that the open gain of the operational amplifier is infinite). If G is 1, then $\Delta V$ is 0 so that the comparison operation cannot be performed. G may take any value so long as 1/G is somewhat smaller than 1.

Figure 19:
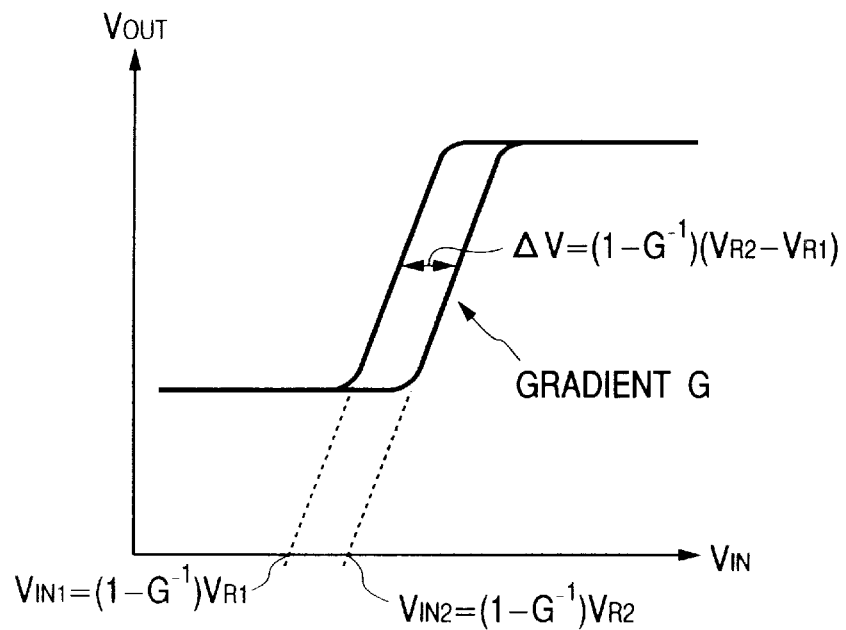
FIG. 19 is a graph showing the comparison operation of a comparator.

As an output of the comparator having the input/output characteristics shown in FIG. 19 is input to the inverters 904 and 905 having a high gain, the input/output characteristics indicated by a solid line in FIG. 20 can be realized.

In this embodiment, the gain at the initial stage of the comparator is lowered by negative feedback, so that a variation in differential pairs can be canceled and discrete comparison can be realized at high precision.

It is obvious that the A/D converter can be structured, for example, by the second and third embodiments. The A/D converter capable of being realized by one comparator may also be used.

In the first to sixth embodiments described above, the circuits shown in FIGS. 11 and 12, FIGS. 14 to 16, and FIG. 18 are each formed on the same semiconductor substrate by using, for example, CMOS processes.

As described above, according to the first to sixth embodiments, for selectively processing a plurality of signal sources having a large output impedance by one comparator or A/D converter, the comparator or A/D converter can be realized which has a consumption current smaller than a conventional circuit and can reduce a variation in gains of each column of an area sensor to which the present invention is applied.

Further, for selectively processing a plurality of signal sources having a large output impedance by one comparator or A/D converter, the A/D converter can be realized which has a consumption current smaller than a conventional circuit, can reduce a variation in gains of each column of the area sensor, and can use N latches for realizing an N-bit resolution.

Still further, for selectively processing a plurality of signal sources having a large output impedance by one comparator or A/D converter, the A/D converter can be realized which has a consumption current smaller than a conventional circuit, can reduce a variation in gains of each column of the area sensor, and can complete A/D conversion by N comparison operations for an N-bit resolution.

A photoelectric converter with a parallel column type A/D conversion function can be realized which has a consumption current smaller than a conventional circuit and can reduce a variation in gains.

In a photoelectric converter with a parallel column type A/D conversion function which can be realized which has a consumption current smaller than a conventional circuit and can reduce a variation in gains, a pixel output during resetting and a pixel output after charge accumulation can be obtained at timings nearer to each other after charge accumulation.

Fixed pattern noises can be removed by subtracting the pixel output during resetting from the pixel output after charge accumulation.

By subtracting the pixel output during resetting from the pixel output after charge accumulation, both the outputs being obtained at timings nearer to each other, fixed pattern noises and random noises of low frequency components can be removed.

Figure 21:
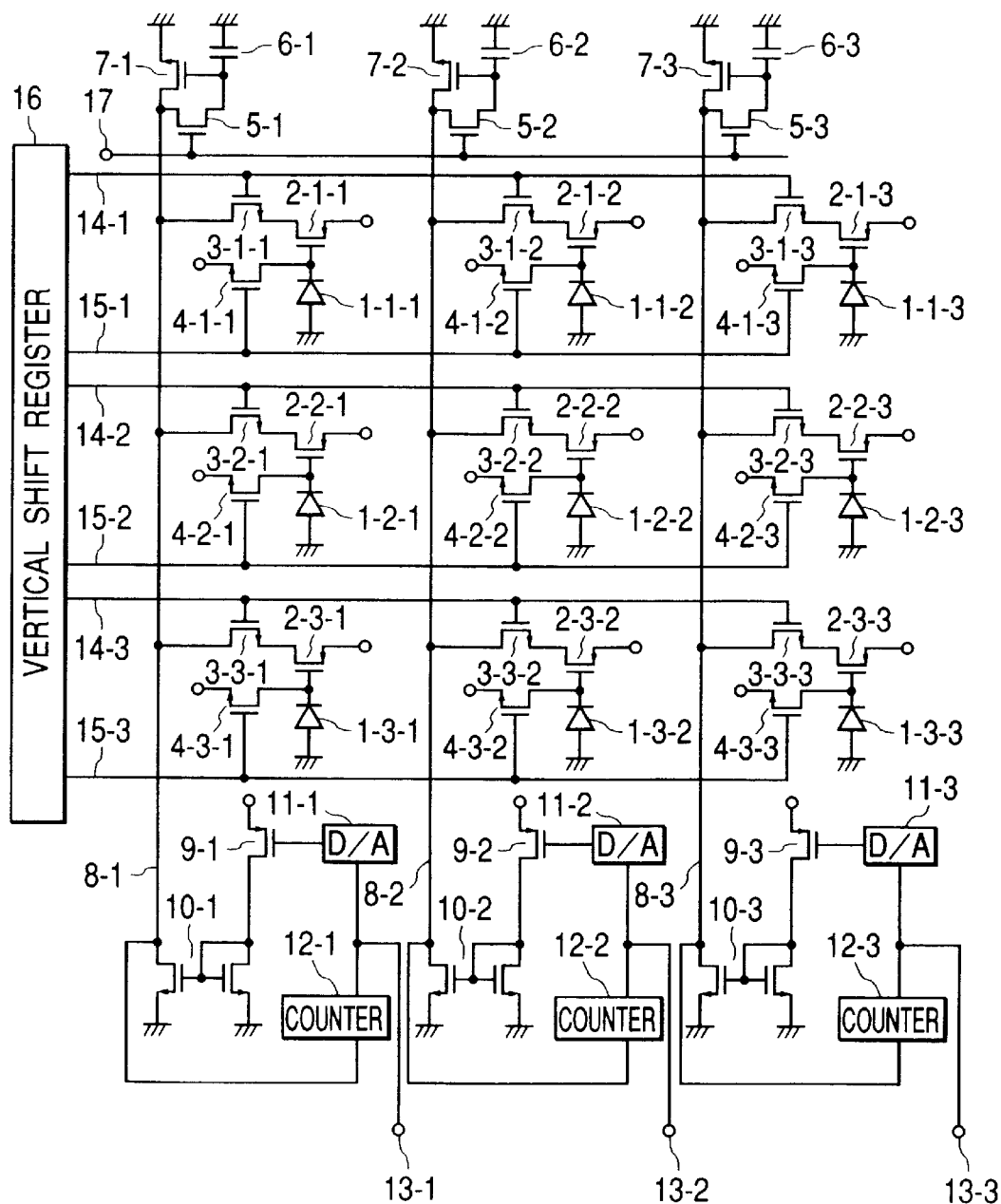
FIG. 21 is a circuit diagram of a solid image pickup element according to an embodiment of the invention.

FIG. 21 shows the seventh embodiment of the invention in which pixels (sensor cells) including amplifying MOS transistors are disposed two-dimensionally. For the purposes of simplicity, pixels are disposed in three rows and three columns. Each sensor cell is constituted of a photodiode 1 (1-1-1, 1-1-2, . . . ), an amplifying PMOS transistor 2 (2-1-1, 2-1-2, . . . ), a select transistor 3 (3-1-1, 3-1-2, . . . ) and a reset transistor 4 (4-1-1, 4-1-2, . . . ). Charges generated in the photodiode 1 are converted into voltage by the gate capacitance of the amplifying transistor 2. When the select transistor 3 turns on as a vertical shift register 16 makes a vertical select line 14 (14-1, 14-2, . . . ) have an "H" level, current corresponding to the gate-source voltage of the amplifying transistor 2 is supplied to a vertical signal line 8 (8-1, 8-2, . . .).

An output voltage from a D/A converter 11 (11-1, 11-2, . . .) which generates an analog voltage corresponding to a digital value of a counter 12 (12-1, 12-2), is applied across the gate and source of a voltage-current converting MOS transistor 9 (9-1, 9-2, . . .). As the initial setting, it is assumed that all bits of the counter 12 are "0" and that the analog output voltage of the D/A converter 11 receiving the digital value of the counter is approximately equal to the reset voltage applied to the reset transistor 4 (4-1, 4-2, . . .) of the sensor cell.

Figure 22:
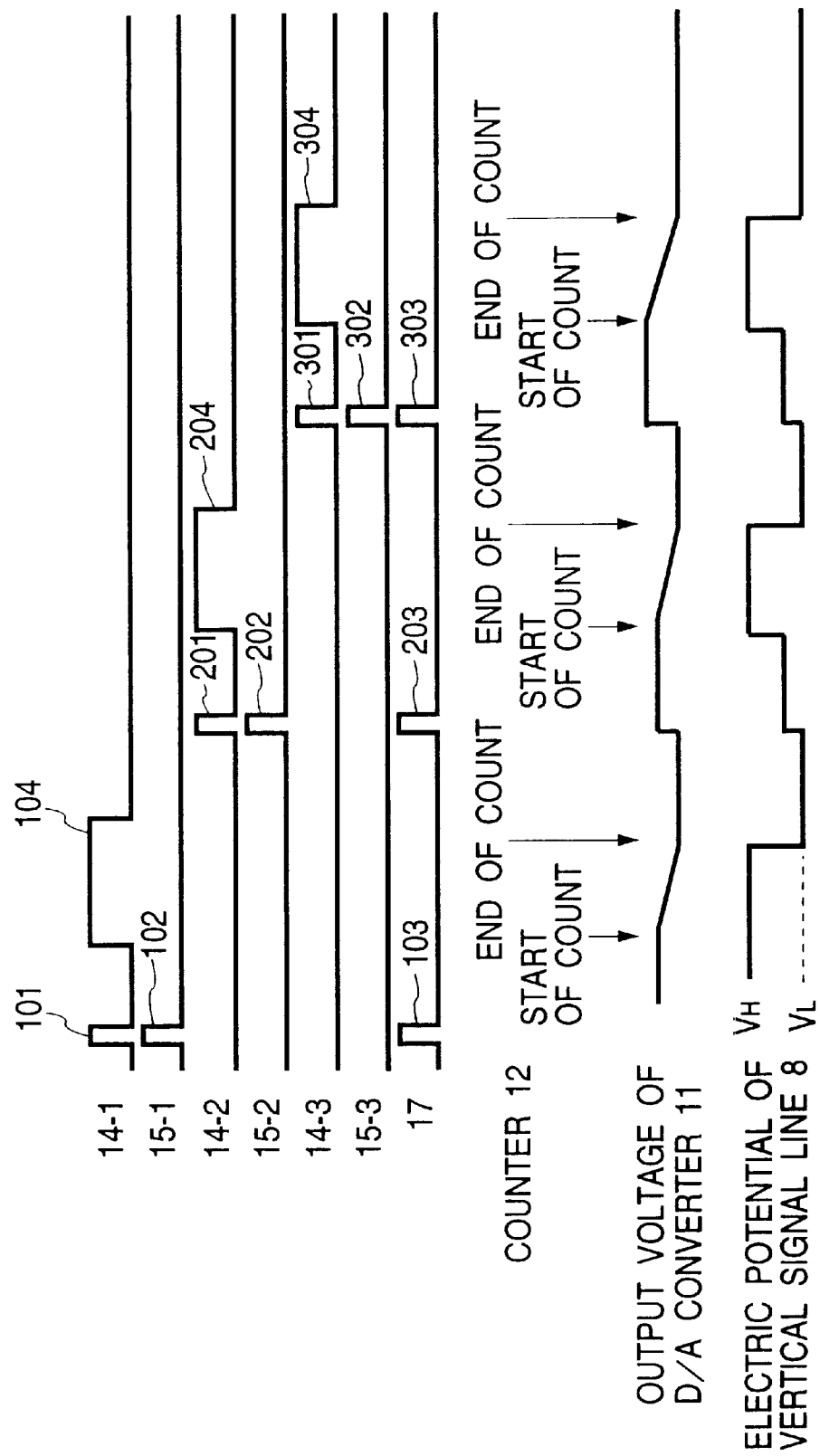
FIG. 22 is a timing chart illustrating the operation of the solid state image element shown in FIG. 21.

With reference also to the timing chart shown in FIG. 22, the operation will be described.

The vertical shift register 16 makes the reset signal line 15-1 (pulse 102) and the vertical select signal line 14-1 (pulse 101) have an "H" level, the reset transistor 4 (4-1-1, 4-1-2, . . .) and select transistor 3 (3-1-1, 3-1-2, . . .) in the sensor cell are turned on, and a reset current corresponding to the reset state of the photodiode 1 is output from the amplifying transistor 2 (2-1-1, 2-1-2, . . .) to a vertical signal line 8 (8-1, 8-2, . . .). At the same time, a terminal 17 is set to the "H" level (pulse 103), the switch 5 (5-1, 5-2, . . .) is turned on to sample the gate-source voltage of a transistor 7 (7-1, 7-2, . . .) generated by the reset current to a capacitor 6 (6-1, 6-2, . . .). Thereafter, since the switch 5 is turned off, the voltage held by the capacitor 6 makes the transistor 7 continue to flow the reset current. As a reset signal line 15-1 takes an "L" level and the reset transistor 4 (4-1-1, 4-1-2, . . .) turns off, signal charges are accumulated in the photodiode 1, and a voltage corresponding to the signal charge amount is applied to the gate of the amplifying transistor 2 (2-1-1, 2-1-2, . . .). At this time, the vertical select line 14-1 is again set to the "H" level (pulse 104) and the select transistor 3 (3-1-1, 3-1-2, . . .) is turned on to output the current of the amplifying transistor 2 to the vertical signal line 8. As different from the amplitude of the reset current, the amplitude of this signal current is larger than the reset current because if charges in the photodiode are electrons, the gate voltage of the amplifying transistor 2 is smaller than that during resetting. Therefore, the potential of the vertical signal line 8 rises to the source potential of the select switch transistor 3 (3-1-1, 3-1-2, . . .) (this raised potential is represented by $V_H$). As the counter 12 (12-1, 12-2, . . .) starts counting from "0" and its digital output is input to the D/A converter 11 (11-1, 11-2), the output voltage of the D/A converter 11 gradually lowers (in this embodiment, the D/A converter lowers an analog output as the input digital value increases), the drain current of the voltage-current converting transistor 9 (9-1, 9-2, . . .) increases and the output current of a current mirror 10 (10-1, 10-2, . . .) also increases. At some timing, the total current of the output current of the transistor 7 flowing the reset current and the output current of the current mirror 10 becomes larger than the output current of the amplifying transistor 2 (2-1-1, 2-1-2, . . .) of the sensor cell, so that the potential of the vertical signal line 8 lowers to some low potential (represented by $V_L$). This potential change of the vertical signal line 8 is detected by, for example, a comparator having a comparison threshold value intermediate between $V_H$ and $V_L$ and at this detection timing, the counter 12 is stopped. Digital data of the counter at this timing has a value corresponding to the charge amount in the photodiode 1. In this manner, analog/digital conversion is performed.

Figure 23:
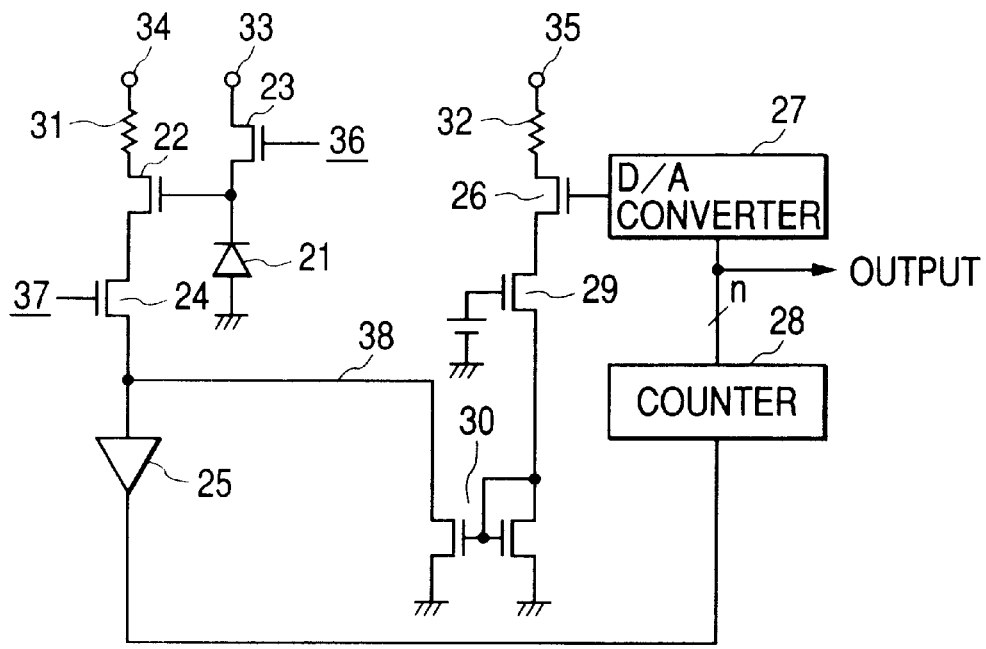
FIG. 23 is a circuit diagram partially showing the structure of a solid image pickup element according to another embodiment of the invention.

FIG. 23 illustrates the eighth embodiment of the invention. In FIG. 23, only the circuit portion regarding a sensor cell unit (pixel) and A/D conversion is shown. Reference numeral 21 represents a photodiode, reference numeral 22 represents an amplifying transistor, reference numeral 23 represents a reset transistor, reference numeral 24 represents a vertical select transistor, reference numeral 25 represents a comparator for detecting a potential change of a vertical signal line, reference numeral 26 represents a transistor for converting an output voltage of a D/A converter 27 into current, reference numeral 28 represents a counter for supplying its digital data to the D/A converter 27, and reference numeral 30 represents a current mirror circuit. A different point from the seventh embodiment shown in FIG. 21 is resistors 31 and 32 connected to the source terminals of the amplifying transistor 22 and voltage-current converting transistor 26.

These resistors 31 and 32 are added from the following reasons. If a large number of sensor cells are used for a signal processing apparatus, a power source wiring line to an amplifying transistor has essentially a wiring resistance. Even if the same signal charges are supplied from the photodiode, an output current of the amplifying transistor changes with this wiring resistance. From this reason, the resistor having a value sufficiently larger than the wiring resistance is added to the source terminal of the amplifying transistor to suppress the effects of the wiring resistance considerably. The resistance is also added to the source terminal of the voltage-current converting transistor in order to improve the precision relative to the output current of the amplifying transistor. In many cases, it is desired to use the resistors having the same value. In this embodiment, therefore, the resistors 31 and 32 are added to the source terminals of the amplifying transistor 22 and voltage-current converting transistor 26.

Figure 24:
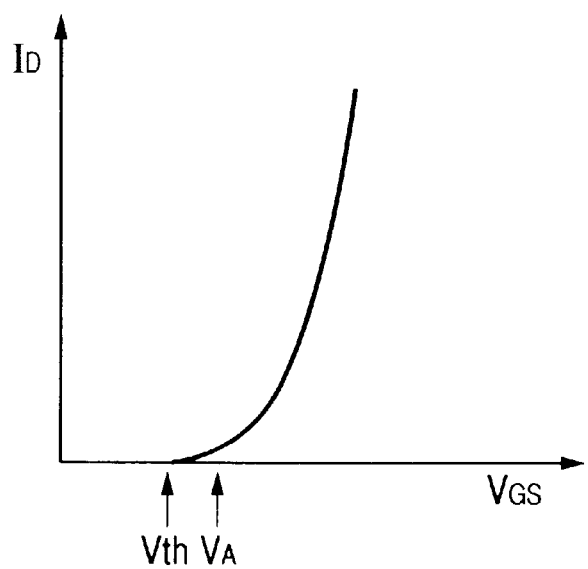
FIG. 24 is a graph showing the relation between a gate-source voltage ($V_{GS}$) and an output drain current (Io) of an amplifying transistor.

The relation between a gate-source voltage ($V_{GS}$) and an output drain current ($I_o$) of the amplifying transistor 22 shown in FIG. 23 is represented by square characteristics such as shown in FIG. 24. The region where $V_{GS}$ is equal to or lower than the threshold voltage $V_{th}$ is called a subthreshold region whose characteristics are represented by an exponential function and linearity between $I_o$ and $V_{GX}$ is very bad. It is therefore preferable that the voltage for resetting the photodiode 1 is controlled to some degree and that $V_{GS}$ of the amplifying transistor during resetting takes a value such as $V_A$ shown in FIG. 24 larger than $V_{th}$ in order not to enter the sub-threshold region.

In FIGS. 21 and 23, PMOS transistors are used as the amplifying transistor of the sensor cell. NMOS transistors of the opposite conductivity type may also be used.

Figure 25:
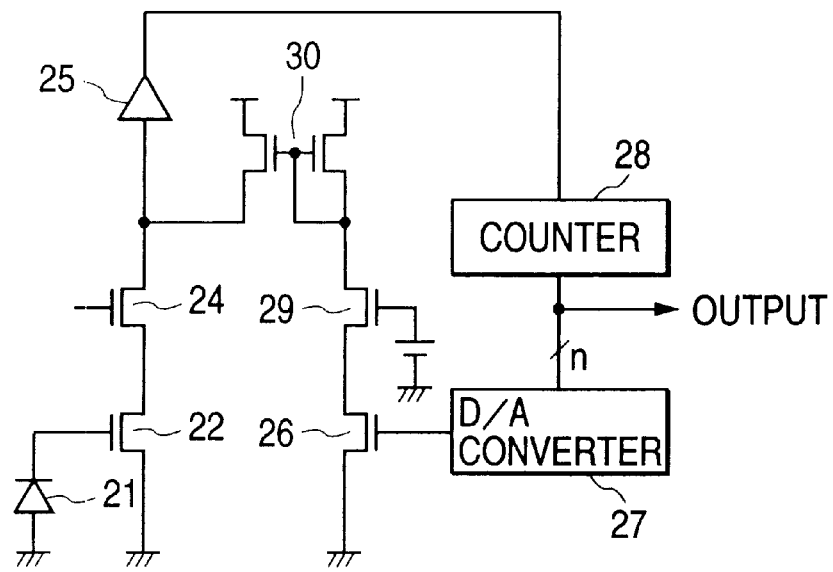
FIG. 25 is a circuit diagram partially showing the structure of a solid state image pickup element according to a modification of the element shown in FIG. 23.

The circuit diagram using NMOS transistors corresponding to the circuit diagram shown in FIG. 23 is shown in FIG. 25. In FIG. 25, identical reference numerals to those shown in FIG. 23 are used since the same elements excepting the conductivity type are used.

As described above, the voltage-current converting MOS transistor has the same conductivity type as that of the amplifying transistor in the sensor cell and the same gate size is used. Under these conditions, output currents are compared so that non-linearity between the input voltage and output current of the amplifying transistor in the sensor cell can be canceled.

Further, the amplifying transistor 2 and voltage-current converting transistor 9 constitute the input stage of the differential amplifier so that fixed pattern noises can be reduced as described in the first to sixth embodiments.

Figure 26:
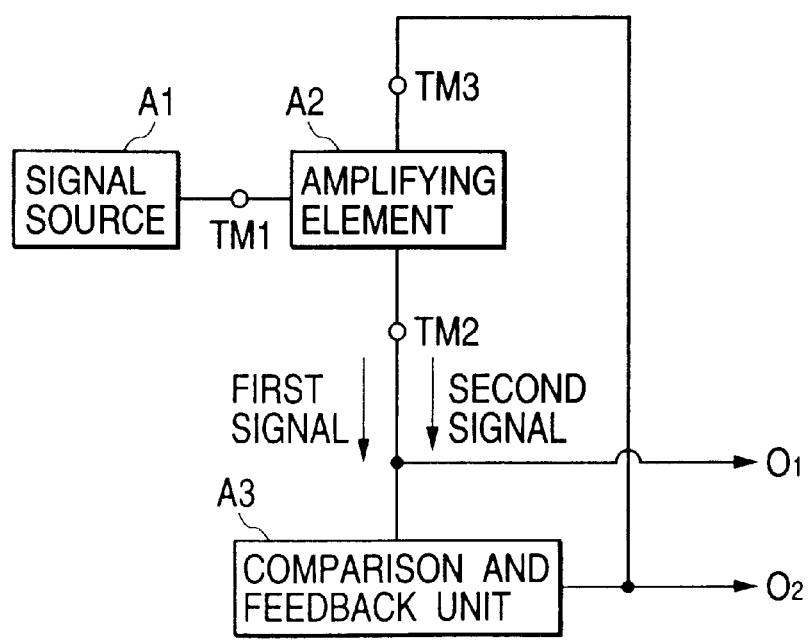
FIG. 26 is a block diagram illustrating the concept of seventh to ninth embodiments.
Figure 27:
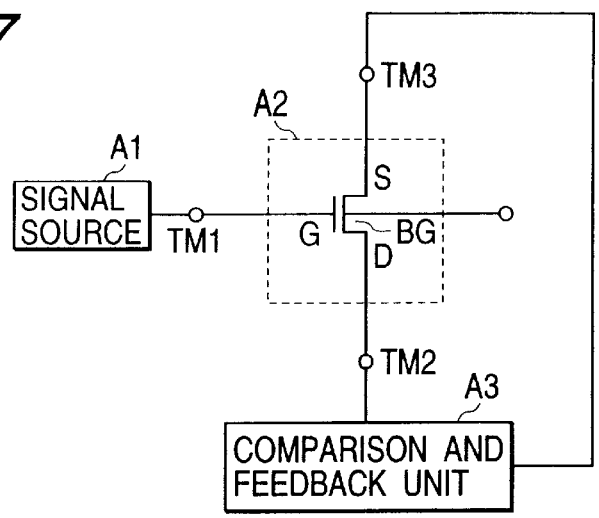
FIG. 27 is a block diagram illustrating the concept of the seventh to ninth embodiments.
Figure 28:
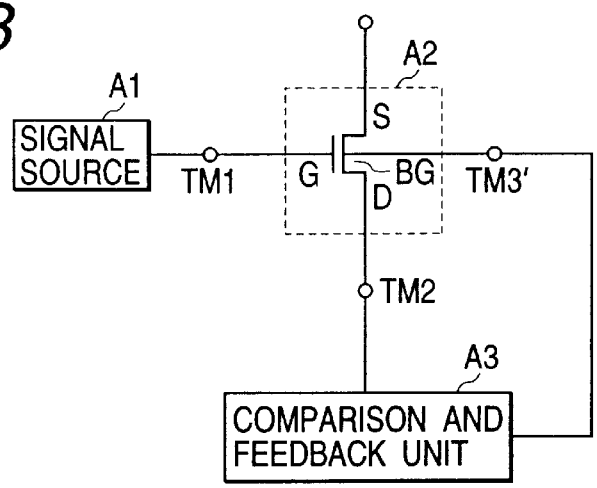
FIG. 28 is a block diagram illustrating the concept of the seventh to ninth embodiments.

With reference to FIGS. 26 to 28, the concept of the ninth embodiment will be described. In FIG. 26, A1 represents a signal source which may be any signal source capable of outputting information in the form of electric signal. For example, the signal source may be a photoelectric conversion element such as a photodiode, a Hall element, a magnetoelectric conversion element such as a magnetoresistive effect element, a semiconductor memory storing an electric signal, a piezoelectric element, a pressure sensor, an acceleration sensor or the like. A2 represents a amplification element such as a transistor which is connected to the signal source A1. The circuit is also provided with a first terminal TM1, a second terminal TM2 from which an amplified signal is output, and a third terminal TM3 for receiving a signal from a comparison/feedback unit A3. The comparison/feedback unit (comparison/output unit) A3 compares first and second signals output from the amplification element A2 and outputs a signal for controlling the level of an output signal from the terminal TM2, to the third terminal TM3.

For example, assuming that the first signal (having a predetermined reference level) is an output of the amplification element A2 when the first terminal TM1 side of the amplification element A2 is reset and the second signal is an output from the amplification element A2 when a signal output from the signal source A1 is input to the amplification element A2, the comparison/feedback unit A3 compares the first signal with the second signal and outputs a signal to the third terminal TM3 so that the level of the second signal becomes near to the level of the first signal. In this case, the level of the second signal changes from the signal level containing noise components of a signal transferred after resetting to the level of the first signal corresponding to the level of noise components. This change is detected as a level change of an output 01 of the amplification element A2 so that signal with noise components removed can be obtained. It is also possible to obtain a signal with noise components removed by detecting the change as a level change in an output 02 of the comparison/feedback unit A3. An output of the amplification element A2 when a signal output from the signal source A1 is input to the amplification element A2 may be used as the first signal, and the reset signal after the first signal is output may be used as the second signal. In this case, the level of the second signal changes from the level of noise components to the level of the signal containing noise components transferred after the resetting.

FIGS. 27 and 28 show the circuits in which a field effect transistor such as an insulated gate type transistor is used as the amplification element. In FIG. 27, a signal from the comparison/feedback unit A3 is input to the source of an insulated gate type transistor. In FIG. 28, a signal from the comparison/feedback unit A3 is input to the back gate terminal of an insulated gate transistor. A terminal TM1 is the gate terminal and a terminal TM2 is a drain terminal.

Figure 29:
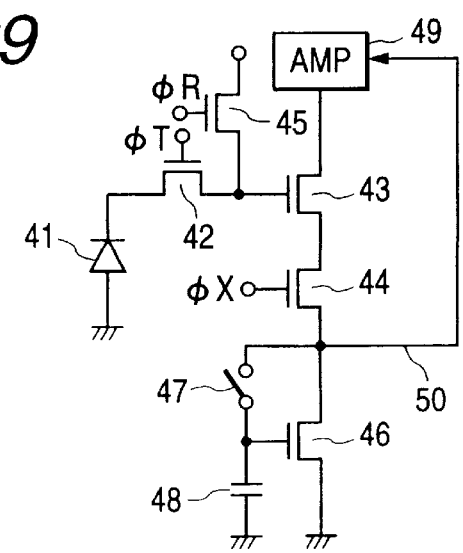
FIG. 29 is a circuit diagram of a solid image pickup element according to an embodiment of the invention.

FIG. 29 is a diagram showing the ninth embodiment of the invention. In FIG. 29, reference numeral 41 represents a photoelectric conversion element, reference numeral 42 represents a transfer transistor for transferring signal charges of the photoelectric conversion element 41 to the gate of an amplifying transistor 43, similar to conventional techniques, reference numeral 44 represents a pixel select transistor, and reference numeral 45 represents a reset transistor. Reference numeral 46 represents a current source transistor for converting a voltage across a capacitor 48 generated from an output current of the amplifying transistor 43 via a switch 47, into current and outputting it. Reference numeral 49 represents a variable voltage source for receiving a difference signal and supplying a voltage corresponding to the difference signal to the source (main electrode) terminal of the amplifying transistor 43, the difference signal being difference between an output current of the current source transistor 46 and an output current of the amplifying transistor 43 output via the pixel select transistor 44.

Figure 30:
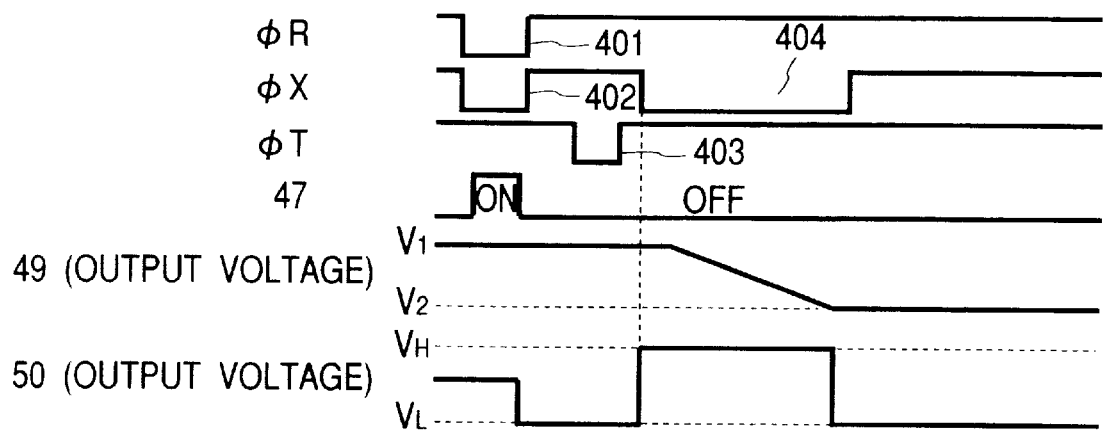
FIG. 30 is a timing chart illustrating the operation of the solid state image pickup element shown in FIG. 29.

In the circuit constructed as above, a method of obtaining a signal voltage corresponding to signal charges in the photoelectric conversion element after the amplifying transistor is reset, will be described illustratively with reference to the timing chart shown in FIG. 30. In the following description, it is assumed that the transistors 42, 43, 44 and 45 are PMOS transistors and the transistor 46 is an NMOS transistor and that the variable voltage source 49 outputs a constant voltage V1. An "L" level (pulse 401) is applied to a terminal φR to turn on the reset transistor 45 and reset the gate terminal of the amplifying transistor 43 to a predetermined potential. At the same time, the "L" level (pulse 402) is applied to a terminal φX to turn on the select transistor 44 and switch 47. The output current when the amplifying transistor 43 is reset is charged in the capacitor 48 in the form of voltage by short-circuiting the gate and drain of the transistor 46. Thereafter, the transistors 45 and 44 and switch 47 are turned off so that signal charges corresponding to light incident upon the photoelectric conversion element are transferred to the gate terminal of the amplifying transistor 43, when the "L" level (pulse 403) is applied to a terminal φT. If the gate potential at this time is lower than that during the resetting, the output current of the amplifying transistor 43 is correspondingly larger than that during resetting. The voltage across the capacitor 48 applied to the transistor 46 is output as the current when the amplifying transistor 43 is reset. As the "L" level (pulse 404) is applied to the terminal φX to again turn on the transistor 44, an output line 50 takes a high potential VH.

Thereafter, as the output voltage of the variable voltage source 49 is gradually lowered, the output current of the amplifying transistor 43 also lowers and eventually becomes equal to the output current of the transistor 46. At this time, the potential at the output line 50 lowers rapidly so that this potential change is detected and the change in the output voltage of the variable voltage source 49 is stopped. If the voltage at this time is V2, a difference voltage (V1–V2) corresponds to a difference between the gate potential of the amplifying transistor 43 during resetting and the potential after signal charges are transferred. Therefore, this difference voltage (V1–V2) is used as a signal voltage corresponding to the signal changes in the photoelectric conversion element.

Figure 31:
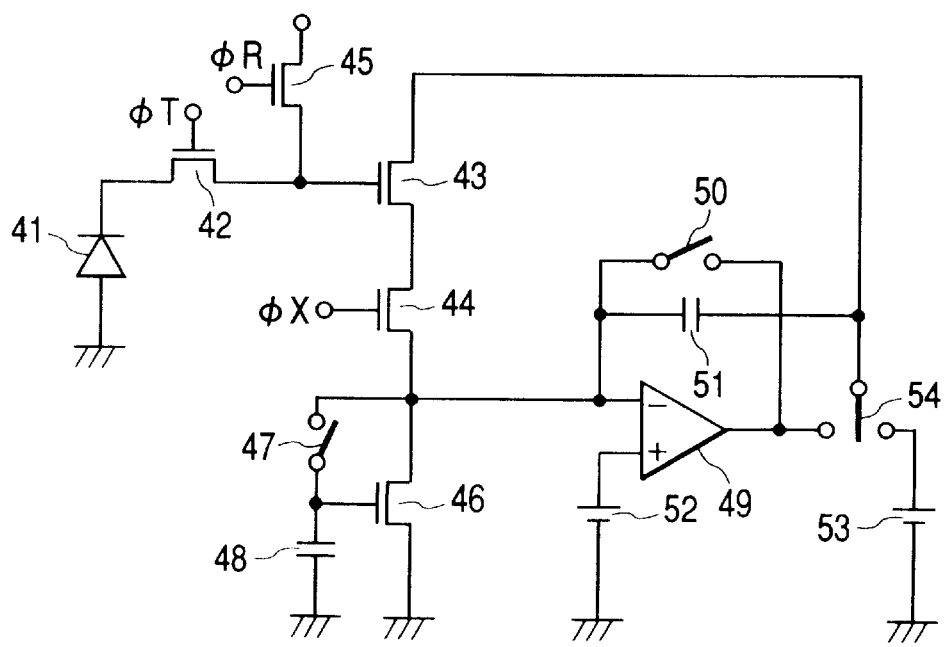
FIG. 31 is a circuit diagram of an analog differential amplifier realizing the variable voltage source having the structure shown in FIG. 29, according to an embodiment of the invention.

FIG. 31 shows an embodiment wherein the variable voltage source having the structure shown in FIG. 29 is realized by an analog differential amplifier circuit.

In this example, after an amplifying transistor 43 is reset, signal charges in a photoelectric conversion element 41 are transferred to the gate of the amplifying transistor 43. Thereafter, a difference current between an output current of the amplifying transistor 43 and an output current of an amplifying transistor 46 is integrated by a differential amplifier 49 and a capacitor 51. When the difference current becomes 0, the change in the output voltage of the differential amplifier 49 stops. The initial state is set in such as manner that the amplifying transistor 43 is reset and at the same time the capacitor 51 is short-circuited by turning on the switch 50 and a switch 54 is set to a power source 53 side. In the initial state, the source potential of the amplifying transistor 43 starts changing from the voltage of the power source 53 when the switch 54 is connected to the differential amplifier 49 side synchronously with the pulse 404. The change stop state corresponding to the above-described difference current of 0 means that the output current of the amplifying transistor 43 is equal to the output current when it is reset, and that the change amount of the gate potential of the amplifying transistor from the reset state to the signal charge transfer is equal to the change amount of the output voltage of the differential amplifier 49.

Figure 32:
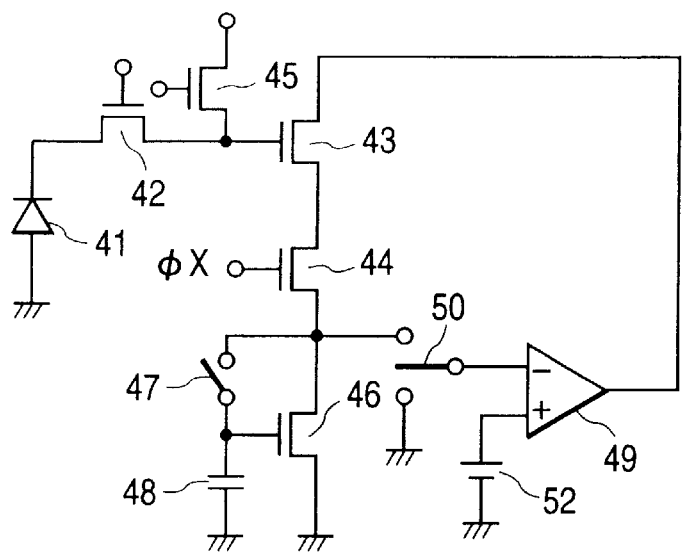
FIG. 32 is a circuit diagram of an analog differential amplifier realizing the variable voltage source having the structure shown in FIG. 29, according to another embodiment of the invention.

FIG. 32 shows another embodiment wherein the variable voltage source having the structure shown in FIG. 29 is realized by an analog differential amplifier circuit. As different from the circuit shown in FIG. 31, an integration circuit is not used but am amplifying transistor 43 and a select transistor 44 are inserted in a simple negative feedback loop. In this example, when the amplifying transistor 43 is reset, a switch 50 is connected to the ground side to operate a differential amplifier 49 as a comparator to allow it to output a predetermined high potential ($V_{HA}$). From the viewpoint of precision, it is preferable that the voltage of a voltage source 52 is set to about a gate-source voltage generated by an output current of the amplifying transistor 43 when the gate-drain of the transistor 46 is short-circuited and the amplifying transistor 43 is reset. After signal charges are transferred to the amplifying transistor 43, the switch 50 is connected to the output terminal side of the transistor 46 synchronously with the pulse 404. Therefore, the differential amplifier 49 operates to control the source voltage of the amplifying transistor 43 to make the output terminal voltage of the transistor be equal to the voltage of the voltage source 52. At this time, the output current of the amplifying transistor 43 is equal to that of the transistor 46. This control change is determined by the bandwidth of the negative feedback loop, and is generally very fast as in the order of several μs. Therefore, the process time is superior to the circuit shown in FIG. 31. If the output terminal voltage of the transistor 46 becomes equal to the voltage of the voltage source 52 when the output voltage of the differential amplifier 49 is $V_{LA}$, then the signal voltage corresponding to signal charges in the photoelectric conversion element is ($V_{HA}$-$V_{LA}$).

Figure 33:
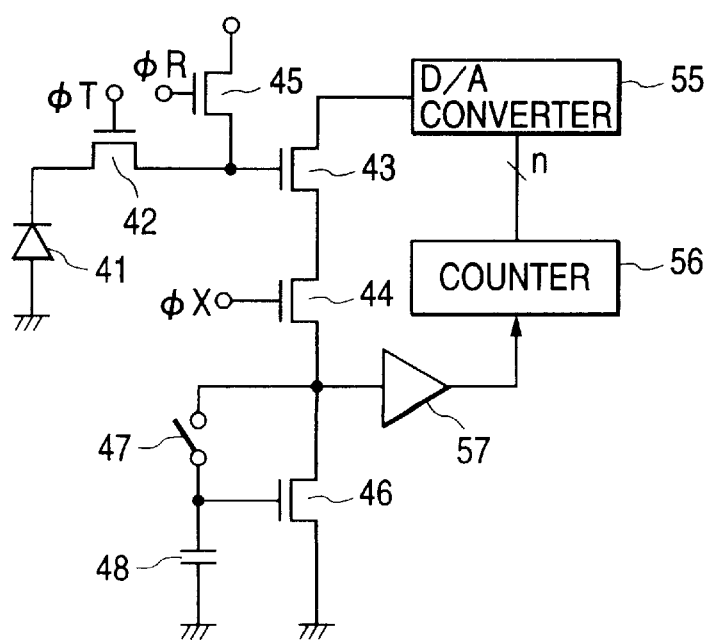
FIG. 33 is a circuit diagram of a circuit realizing the structure shown in FIG. 29, according to another embodiment of the invention.

FIG. 33 shows still another embodiment in which the variable voltage source shown in FIG. 29 is realized by a D/A converter 55, an output signal difference between an amplifying transistor 43 and a transistor 46 is detected by a comparator 57 whose output is used for controlling the operation of a counter 56 which supplies a digital signal to the D/A converter 55. The D/A converter 55 is set so that it outputs a predetermined high potential (VHD) when the reset transistor 45 is turned on to reset the amplifying transistor 43 similar to the operation of the circuit shown in FIG. 29. After the counter 56 is reset, count operation is not performed. The output current of the amplifying transistor 43 during resetting charges via the select transistor 44 the capacitor 48 of the transistor 46 with the switch 47 being turned on, so that a voltage necessary for flowing the reset current is generated across the capacitor 48. Thereafter, the transfer transistor 42 is turned on to transfer signal charges in the photoelectric conversion element 41 to the gate of the amplifying transistor 43. When the select transistor 44 is again turned on, the input potential to the comparator 57 rises to a predetermined high potential ($V_H$). Thereafter, the counter 56 starts counting and outputs its digital count signal to the D/A converter 55. The output voltage of the D/A converter 55 gradually lowers (assuming that the D/A converter 55 generates a negative analog output voltage relative to the input digital signal). At some timing, the output current of the amplifying transistor 43 and the output current of the transistor 46 become equal so that the input voltage of the comparator 57 rapidly lowers. This change is detected and the count operation of the counter 56 is stopped.

The digital value changed from the count start to stop of the counter 56 corresponds to the amount of signal charges in the photoelectric conversion element 41 so that the A/D conversion can be achieved.

Figure 34:
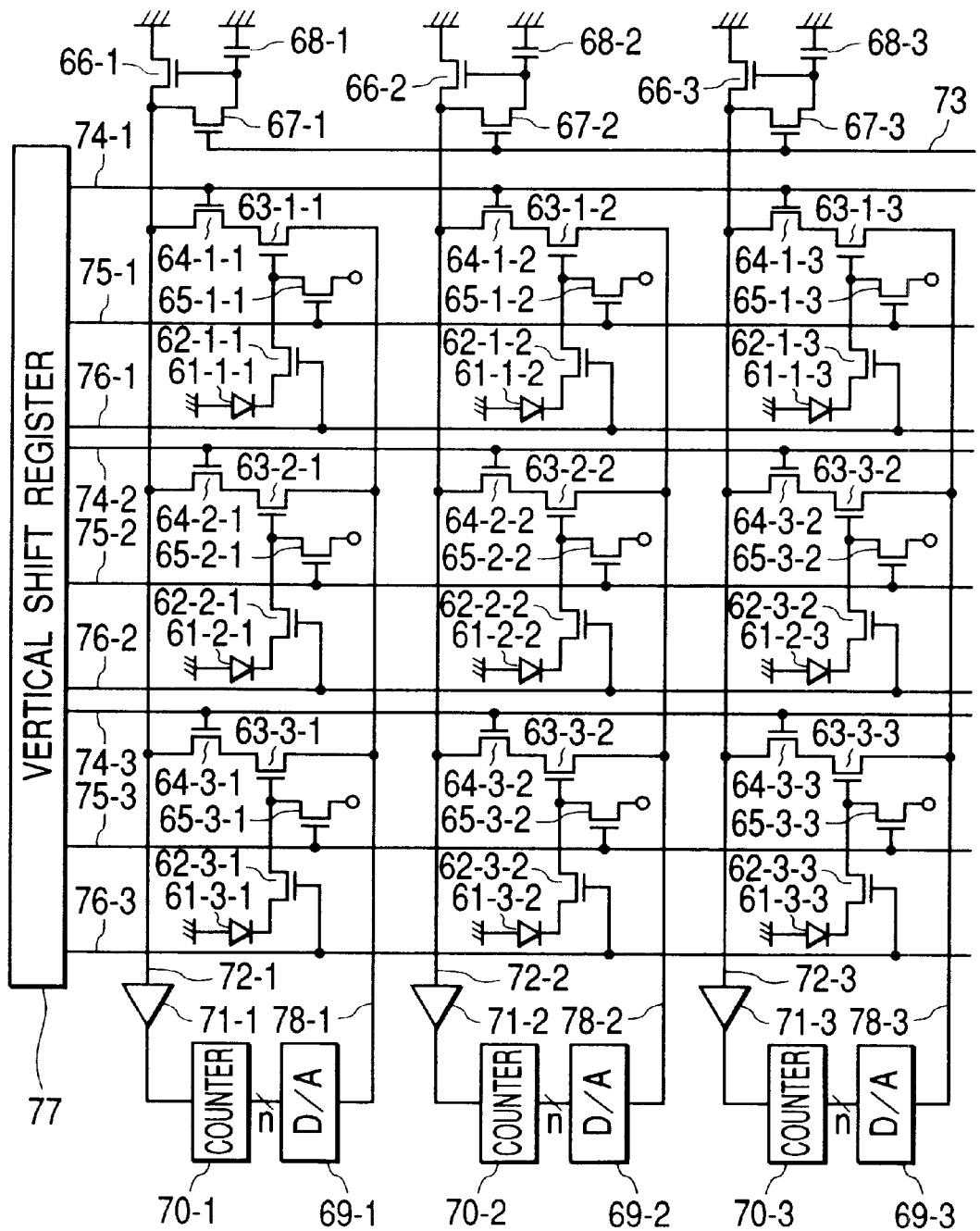
FIG. 34 is a circuit diagram showing the structure of the solid image pickup element of the embodiment shown in FIG. 33 in which the photoelectric conversion units are disposed two-dimensionally in three rows and three columns.

FIG. 34 is a circuit diagram of a signal processing circuit in which the embodiment shown in FIG. 33 is applied to a pixel layout of two-dimensional three rows and three columns. The structure of the circuit is similar to that shown in FIG. 25, including: photoelectric conversion elements 61 (61-1-1, 61-1-2, . . . ); transfer transistors 62 (62-1-1, 62-1-2, . . . ); amplifying transistors 63 (63-1-1, 63-1-2, . . . ); pixel select transistors 64 (64-1-1, 64-1-2, . . . ); reset transistors 65 (65-1-1, 65-1-2, . . . ); constant current transistors 66 (66-1, 66-2, . . . ); switches 67 (67-1, 67-2, . . . ) and capacitors 68 (68-1, 68-2, . . . ) for holding a voltage generated across the gate and source of the transistor 66 by an output current of the amplifying transistor 63; comparators 71 (71-1, 71-2, . . . ) for detecting potential changes on vertical signal lines 72 (72-1, 72-2, . . . ); counters 70 (70-1, 70-2, . . . ) for supplying digital signals to D/A converters 69 (69-1, 69-2, . . . ); and the like.

In order to obtain pixel outputs of the first row, a vertical shift register 77 sets an "L" level to a drive line 75-1 to turn on the reset transistors 65 (65-1-1, 65-1-2, . . . ). Thereafter, the "L" level is set to a drive line 74-1 to turn on the pixel select transistors 64 (64-1-1, 64-1-2, 64-1-3) so that the output currents of the amplifying transistors 63 (63-1-1, 63-1-2, 63-1-3) during resetting are output to the vertical signal lines 72 (72-1, 72-2, 72-3). An "H" level is applied to a drive line 73 to turn on the switches 67 (67-1, 67-2, 67-3) and make the capacitors 68 (68-1, 68-2, 68 -3) hold voltages generated across the gate and source when the output currents of the transistors 66 during resetting are supplied.

Thereafter, similar to the operation of the circuit shown in FIG. 33, the counters 70 (70-1, 70-2, 70-3) start count operations. The D/A converters 69 (69-1, 69-2, 69-3) therefore lower their output voltages, and the comparators 71 detect potential changes on the vertical signal lines 12 when the operations of the counters 70 are stopped. A change amount from the count start to end is used as a digital output to complete an A/D conversion.

Figure 35:
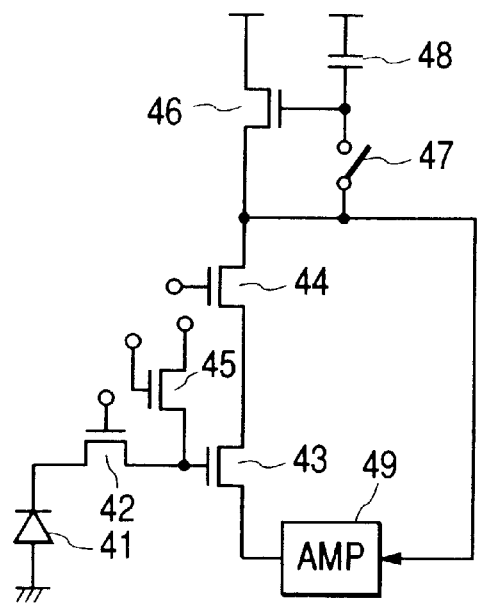
FIG. 35 is a circuit diagram of a solid state image pickup element according to a modification of the embodiment shown in FIG. 29.

FIG. 35 shows another embodiment in which amplifying transistors, select transistors, transfer transistors and the like in the photoelectric conversion units are NMOS transistors. This embodiment can be realized easily from the embodiment shown in FIG. 29 and other embodiments. In FIG. 35, since elements are similar to those shown in FIG. 29 excepting the conductivity type, identical reference numerals are used.

In the seventh to ninth embodiments described above, the voltage of a reset variable voltage source is set so that the gate-source voltage becomes slightly higher than the threshold voltage when the amplifying transistor of a pixel is reset. Therefore, if the output voltage is determined by controlling the voltage of the variable voltage source, the output current of the amplifying transistor is small so that the influences of parasitic resistance of the power supply wiring can be neglected.

Figure 36:
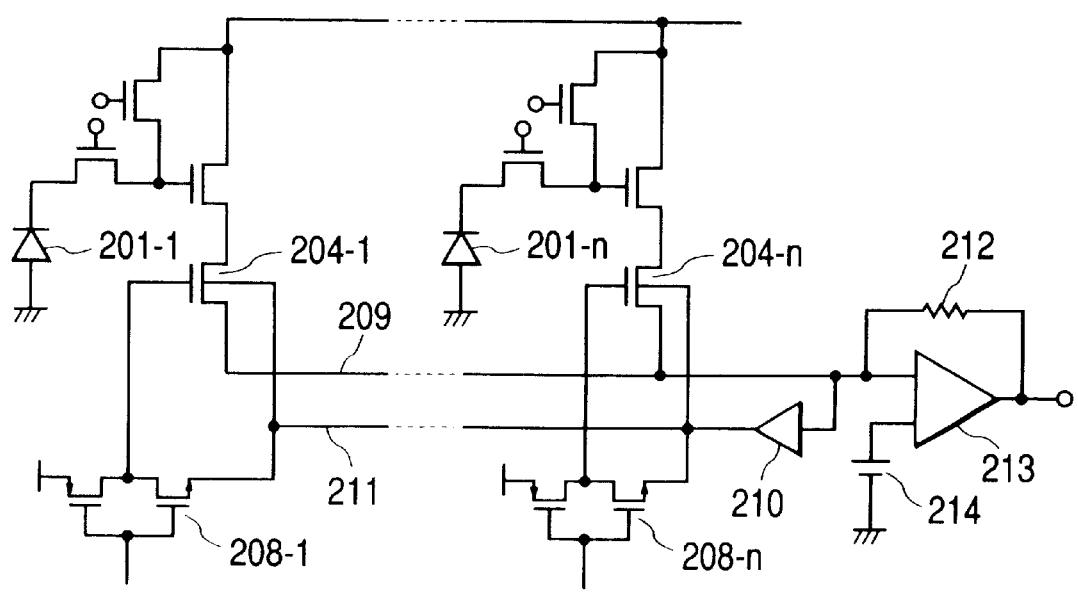
FIG. 36 is a circuit diagram of a solid state image pickup element according to a modification of the embodiment of the invention.

If the potential change speed of the common signal line lowers by parasitic capacitance of the common signal line or if the differential amplifier becomes unstable, because of a small output current of the amplifying transistor, it is effective to use a buffer amplifier 210 such as shown in FIG. 36 and drive one of the two terminals of a parasitic capacitor, which is not on the common signal line side. The buffer amplifier 210 receives the potential on the common signal line and generates the same potential in terms of AC.

Figure 9:
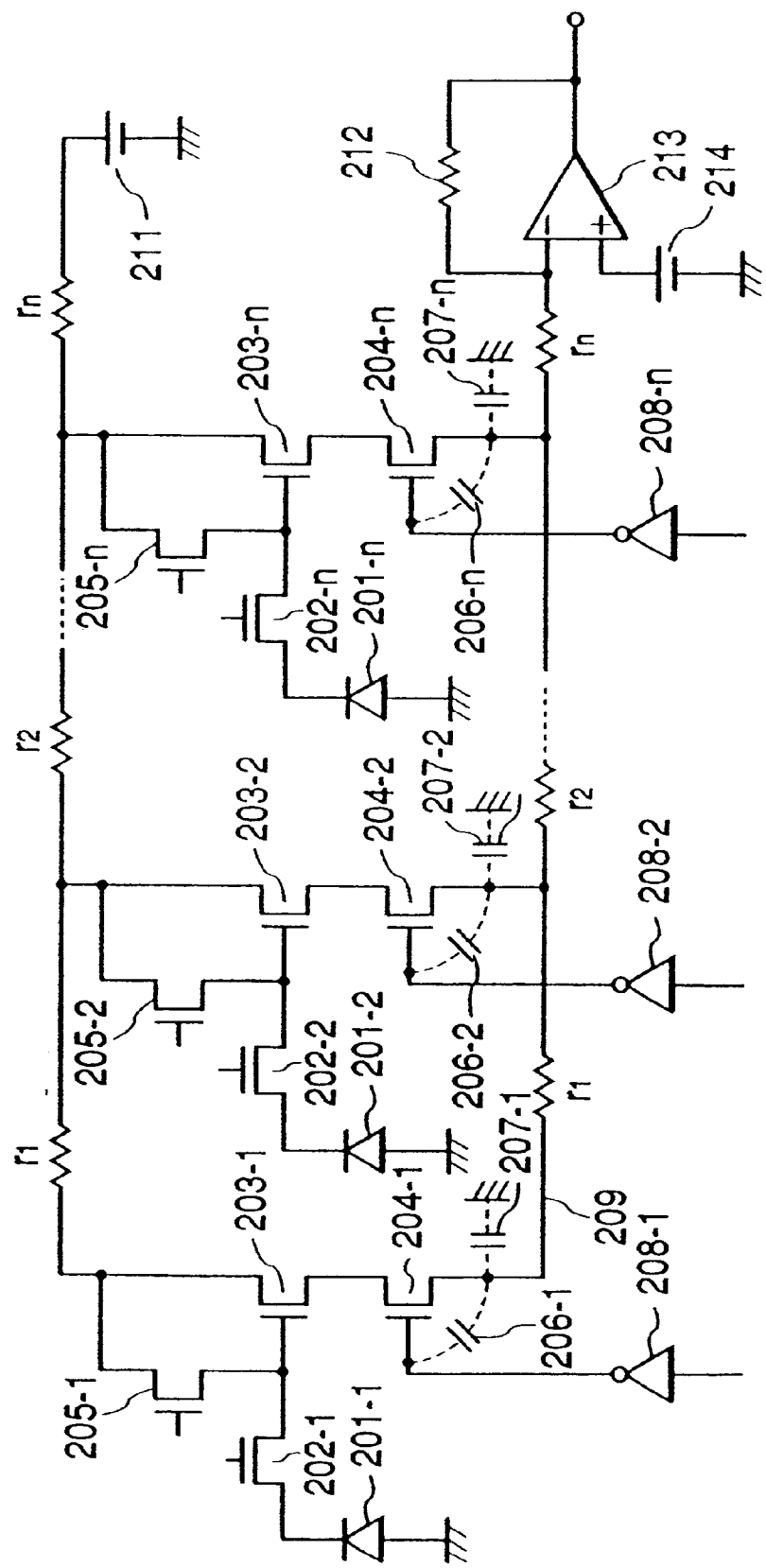
FIG. 9 is a circuit diagram of a number of photoelectric conversion units shown in FIG. 6 disposed in parallel in which pixel signals are output to a common signal line via pixel select switches.

Reference numerals 208-1 to 208-n denote the inverters 208-1 to 208-n shown in FIG. 9. The source terminal of an nMOS transistor 208 is connected to the output of the buffer amplifier 210. The output of the buffer amplifier 210 is connected to the back gate of a transistor 204-1. Since the source terminal of the nMOS transistor 208-1 is connected to the output of the buffer amplifier 210, when the nMOS transistor 208-1 turns on, a voltage across the parasitic capacitance (such as gate-source overlapping capacitance) between the gate and source of the transistor 204-1 becomes constant. Since the output of the buffer amplifier 210 is connected to the back gate of the transistor 204-1, a terminal based voltage of a junction parasitic capacitance of the source region also becomes constant. Since the terminal based voltage of the parasitic capacitor is constant, current will not flow and the function of the capacitor is lost.

The circuits of the seventh to ninth embodiments shown in FIGS. 21, 23, 25 and 29 and FIGS. 31 to 36 are each formed on the same semiconductor substrate by CMOS processes or the like.

As described above, according to the seventh to ninth embodiments, sensor signals of each column can be A/D converted while sensor linearity is improved considerably by incorporating a simple circuit structure. An A/D conversion time per each column can therefore be prolonged by a multiple of the number of vertical columns, as compared to a conventional circuit using only one A/D converter.

Non-linearity of an amplifying transistor of a sensor cell can be solved, and insufficient canceling of non-linearity caused by a manufacture variation in reference amplifying transistors used for canceling can be solved. Therefore, the non-linearity and manufacture variation will not adversely affect output signals and highly precise output signals can be obtained.

Circuits necessary for reducing noises caused by transistor manufacture variation can be realized by a small number of circuit elements so that consumption power and chip occupying area can be reduced.

Figure 37:
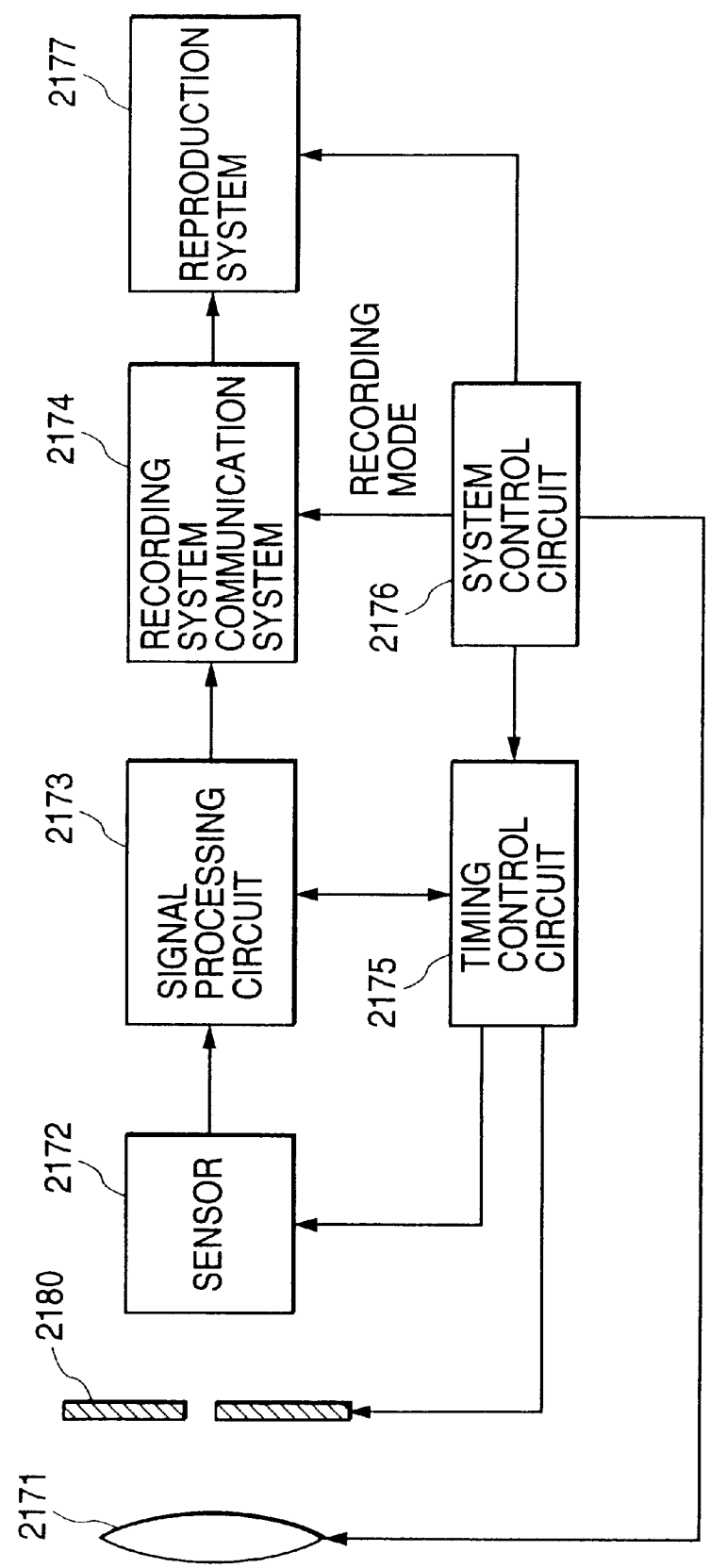
FIG. 37 is a schematic diagram showing an image pickup system using solid state image pickup elements of one of the first to ninth embodiments.

FIG. 37 is a schematic diagram showing an image pickup apparatus. As shown in FIG. 37, object light passing through an optical system 2171 and an iris 2180 becomes incident upon solid state image pickup elements (CMOS sensor) 2172 each having a pixel unit, an A/D conversion unit and the like described with the first to ninth embodiments and formed on the same semiconductor substrate by CMOS processes. The pixel array disposed on the CMOS sensor 2172 converts light information into electric signals and outputs them after noises are removed. This output signal is processed by predetermined methods by a signal processing circuit. The processed signal is recorded or transmitted by a recording/communication system 2174. The recorded or transmitted signal is reproduced by a reproduction system 2177. The iris 2180, CMOS sensor 2172, and signal processing circuit 2173 are controlled by a timing control circuit 2175. The optical system 2171, timing control circuit 2175, recording/communication system 2174 and reproduction system 2177 are controlled by a system control circuit 2176.

Figure 38:
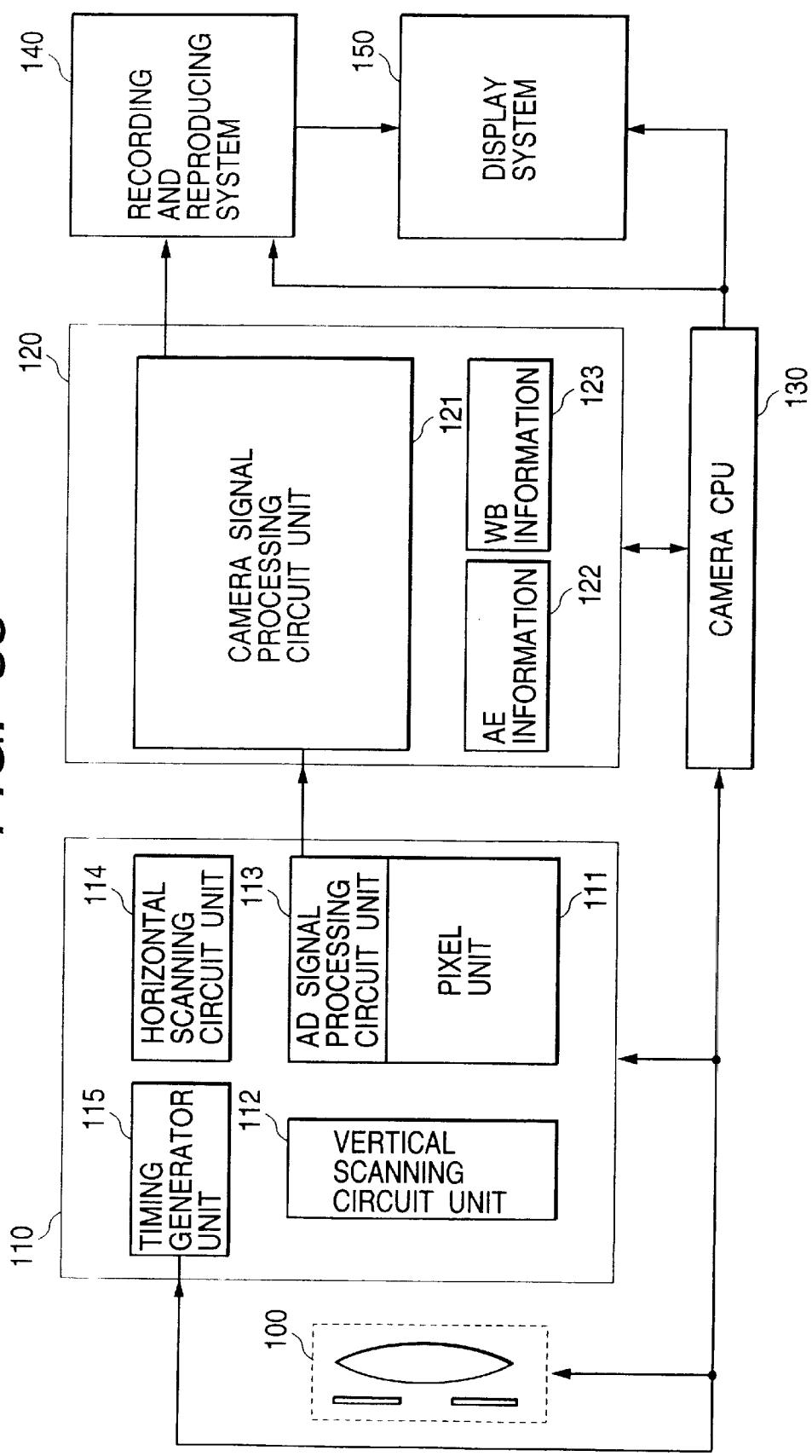
FIG. 38 is a diagram showing an image pickup system according to a tenth embodiment of the invention.

FIG. 38 is a diagram showing the overall structure of an image pickup system used for illustrating the tenth embodiment. In FIG. 38, reference numeral 100 represents an optical system including an iris and a taking lens, reference numeral 110 represents a solid state image pickup unit. The solid state image pickup unit 110 includes: a pixel unit 111 having pixels disposed in a two-dimensional area each constituted of a pixel amplifier and a control switch; a vertical scanning circuit unit 112 for scanning the pixel unit; an analog/digital (A/D) signal processing circuit unit 113 including a noise canceling circuit, a gain control circuit and A/D converter circuit for correcting a variation in pixel signals supplied from the pixel unit 111; a horizontal scanning circuit unit 114 for controlling the A/D signal processing circuit 113; and a timing generator (TG) unit 115. The solid state image pickup unit 110 is formed on the same semiconductor substrate by CMOS processes or the like.

The timing generator (TG) unit 115 controls the pixel unit and each circuit unit of the solid image pickup unit 110 in response to pulses supplied from a cameral CPU 130. AD data from the solid state image pickup unit 110 is input to a camera signal processing circuit unit 120.

The camera signal processing unit 120 has a camera signal processing circuit unit 121, an AE (automatic exposure) data detecting circuit unit 122 and a white balance data detecting circuit unit 123.

The camera signal processing circuit unit 121 performs luminance signal processing and color signal processing for AD data. The AE data detecting circuit unit 122 detects an image signal level from the luminance data supplied from the camera signal processing circuit unit 121 and generates AE data. In accordance with the AE data, the range of a ramp reference voltage of a D/A converter circuit of the A/D signal processing circuit unit 113 to be described later is changed to make the pixel signal have an optimum value in the AD input voltage range. As will be later described, if the pixel signal is small, the amplitude of the ramp reference voltage is made small, whereas if the pixel signal is large, the amplitude of the ramp reference voltage is made large. In this manner, the AD input voltage is made as large as possible. Next, the WB data detecting circuit unit 123 compares the levels of color signals R, G and B supplied from the camera signal processing circuit unit 121 to control the ramp reference voltage for each color.

Whether the ramp reference voltage is controlled by AE data or WB data is determined from the specifications of the image pickup system. The AE data and WB data may be independently used for the control, the AE data may be used for the control of the total level, of the WB data may be used for the control of the signal level of each color. With this control, the level of an input signal to the AID converter becomes large so that an S/N ratio is prevented from being lowered and the quantization error of the AID converter can be reduced.

The camera CPU 130 controls the image pickup system, particularly the camera signal processing circuit unit. Reference numeral 140 represents a recording/reproducing system, and reference numeral 150 represents a display system.

Figure 39:
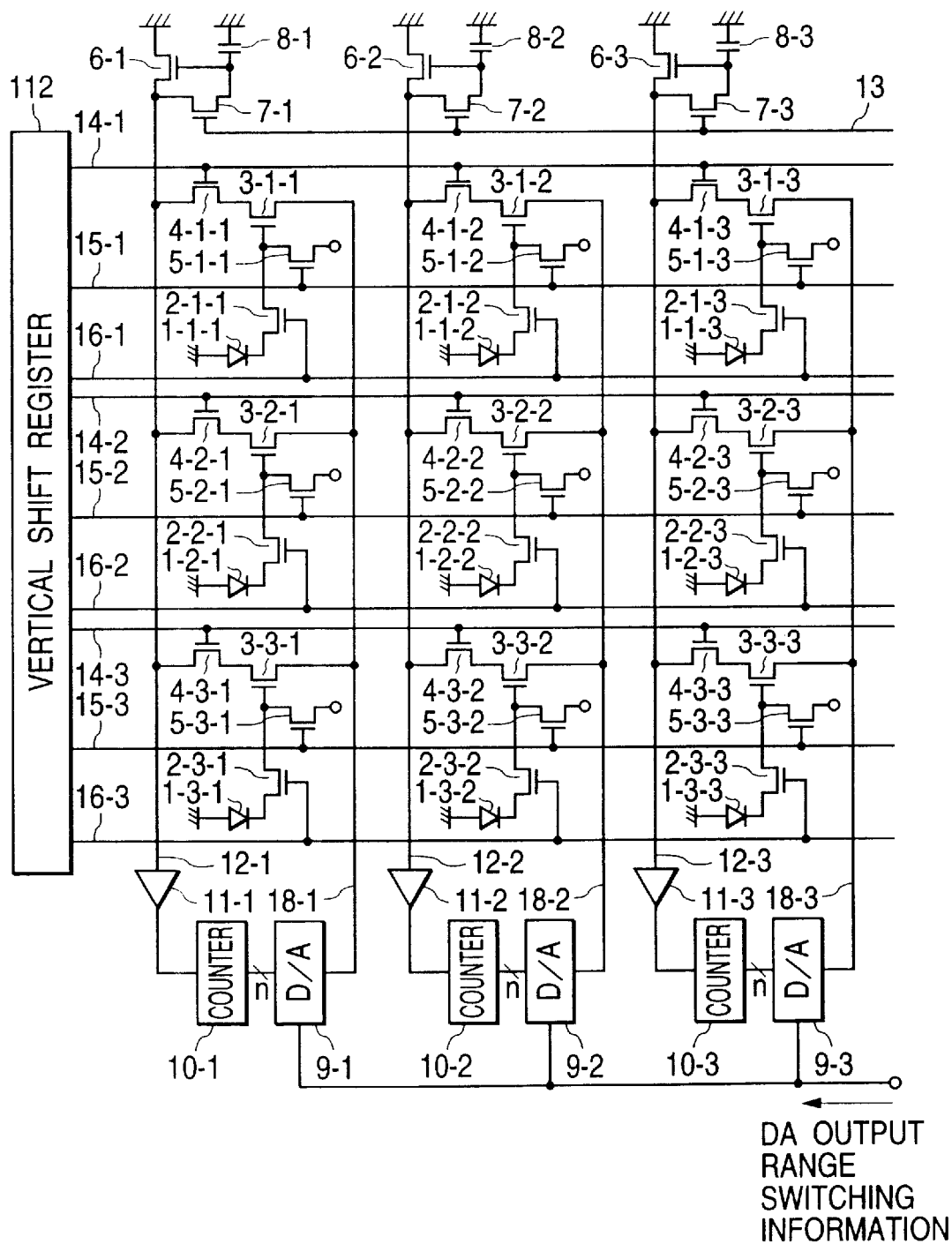
FIG. 39 is a circuit diagram of a pixel unit, a noise cancelling A/D converter unit and a vertical scanning circuit of the image pickup system shown in FIG. 38.

FIG. 39 is a schematic circuit diagram of the pixel unit 111, A/D signal processing circuit unit 113 and vertical scanning circuit unit 112. In FIG. 39, reference numeral 11 represents a comparator, reference numeral 10 represents a counter, and reference numeral 9 represents a D/A converter.

Figure 40:
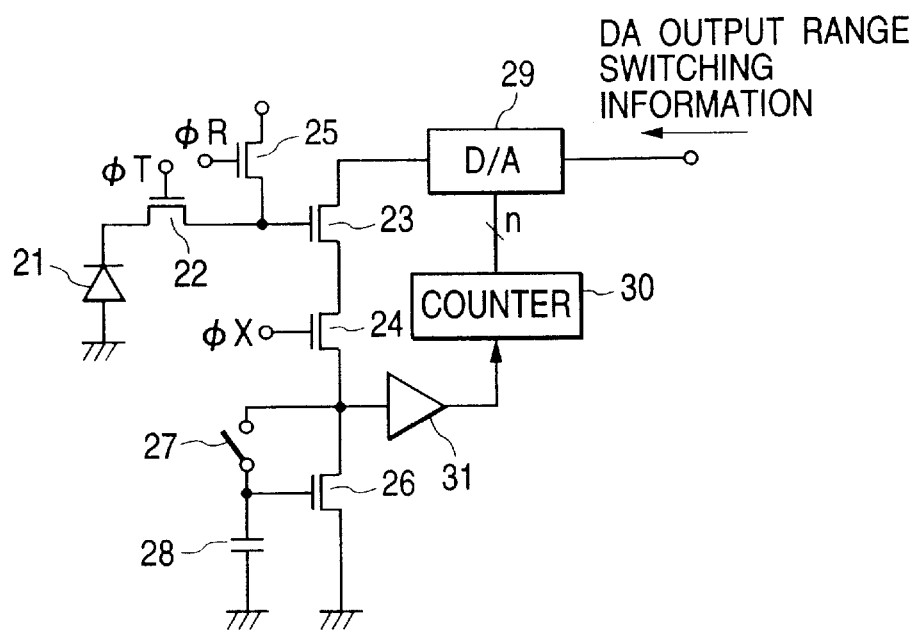
FIG. 40 is an equivalent circuit block diagram showing a pixel of the pixel unit and the noise cancelling A/D converter unit.

FIG. 40 is an equivalent circuit block diagram showing one pixel in the pixel unit and a noise canceling/A-D converter circuit unit. DA output range switching data is input to a D/A converter to change the range of a ramp reference voltage.

Referring to FIG. 40, reference numeral 21 represents a photoelectric conversion element, reference numeral 22 represents a transfer transistor for transferring signal charges in the photoelectric conversion element 21 to the gate of an amplifying transistor 23, and reference numeral 24 represents a pixel select transistor. Reference numeral 25 represents a rest transistor, and reference numeral 26 represents a current source transistor for holding a voltage corresponding to the output current of the amplifying transistor 23 by a switch 27 and a capacitor 28 and outputting a signal by converting the voltage into current. Reference numeral 31 represents a comparator for detecting a difference between the output current of the current source transistor 26 and the output current of the amplifying transistor 23 output via the pixel select transistor 24. Reference numeral 30 represents a counter for counting an output from the comparator 31. Reference numeral 29 represents a D/A converter for outputting a voltage signal to the source (main electrode) terminal of the amplifying transistor 23 by using the digital signal output from the counter 30. DA output range switching data is input to the D/A converter 29, so that the range of a ramp reference voltage output from the D/A converter is switched to control the pixel signal to have an optimum value in the AD input voltage range.

Figure 41:
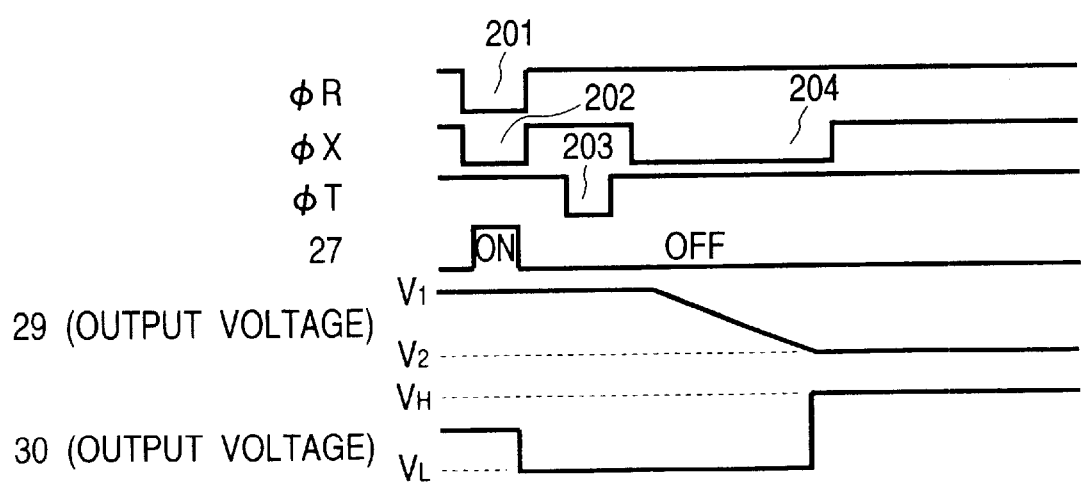
FIG. 41 is a timing chart illustrating the operation of the circuit shown in FIG. 40.

In the circuit constructed as above, a method of obtaining a signal voltage corresponding to signal charges in the photoelectric conversion element after the amplifying transistor is reset, will be described illustratively with reference to the timing chart shown in FIG. 41. In the following description, it is assumed that the transistors 22, 23, 24 and 25 shown in FIG. 40 are PMOS transistors and the transistor 26 is an NMOS transistor, that the D/A converter 29 outputs a high potential ($V_{HD}$), and that the counter 30 is reset and then a count operation is not performed. An "L" level (pulse 201) is applied to a terminal φR to turn on the reset transistor 25 and reset the gate terminal of the amplifying transistor 23 to a predetermined potential. At the same time, the "L" level (pulse 202) is applied to a terminal φX to turn on the select transistor 24 and switch 27. The output current when the amplifying transistor 23 is reset is charged in the capacitor 28 in the form of voltage (comparison reference voltage) by short-circuiting the gate and drain of the transistor 26. Thereafter, the transistors 25 and 24 and switch 27 are turned off so that signal charges corresponding to light incident upon the photoelectric conversion element are transferred to the gate terminal of the amplifying transistor 23. The "L" level (pulse 203) is applied to a terminal φT to turn on the transfer transistor 22. If the gate potential at this time is lower than that during the resetting, the output current of the amplifying transistor 23 is correspondingly larger than that during resetting. The voltage across the capacitor 28 applied to the transistor 26 results in the current which flows when the amplifying transistor 23 is reset. As the "L" level (pulse 204) is applied to the terminal φX to again turn on the transistor 24, the input potential of the comparator 31 rises to a predetermined a high potential ($V_H$). Thereafter, the counter 30 starts counting and outputs its digital count signal to the D/A converter 29. The output voltage of the D/A converter 29 gradually lowers (assuming that the D/A converter 29 generates a negative analog output voltage relative to the input digital signal). At some timing, the output current of the amplifying transistor 23 and the output current of the transistor 26 become equal so that the input voltage of the comparator 31 rapidly lowers. This change is detected and the count operation of the counter 30 is stopped.

The digital value changed from the count start to stop of the counter 30 corresponds to a difference between the gate potentials of the amplifying transistor 23 during resetting and after transferring of the signal charges, so that the A/D conversion can be achieved.

FIG. 39 is a circuit diagram of a signal processing circuit in which the structure shown in FIG. 40 is applied to a pixel layout of two-dimensional three rows and three columns. The structure of the circuit is similar to that shown in FIG. 40, including: photoelectric conversion elements 1 (1-1-1, 1-1-2, . . . ); transfer transistors 2 (2-1-1, 2-1-2, . . . ); amplifying transistors 3 (3-1-1, 3-1-2, . . . ); pixel select transistors 4 (4-1-1, 4-1-2, . . . ); reset transistors 5 (5-1-1, 5-1-2, . . . ); constant current transistors 6 (6-1, 6-2, . . . ); switches 7 (7-1, 7-2, . . . ) and capacitors 8 (8-1, 8-2, . . . ) for holding a voltage generated across the gate and source of the transistor 6 by an output current of the amplifying transistor 3; comparators 11 (11-1, 11-2, . . . ) for detecting potential changes on vertical signal lines 12 (12-1, 12-2, . . . ); counters 10 (10-1, 10-2, . . . ) for supplying digital signals to D/A converters 9 (9-1, 9-2, . . . ); and the like.

In order to obtain pixel outputs of the first row, a vertical shift register 15 sets an "L" level to a drive line 15-1 to turn on the reset transistors 5 (5-1-1, 5-1-2, . . . ). Thereafter, the "L" level is set to a drive line 14-1 to turn on the pixel select transistors 4 (4-1-1, 4-1-2, 4-1-3) so that the output currents of the amplifying transistors 3 (3-1-1, 3-1-2, 3-1-3) during resetting are output to the vertical signal lines 12 (12-1, 12-2, 12-3). An "H" level is applied to a drive line 13 to turn on the switches 7 (7-1, 7-2, 7-3) and make the capacitors 8 (8-1, 8-2, 8-3) hold voltages generated across the gate-source when the output currents of the transistors 6 during resetting are supplied.

Figure 46:
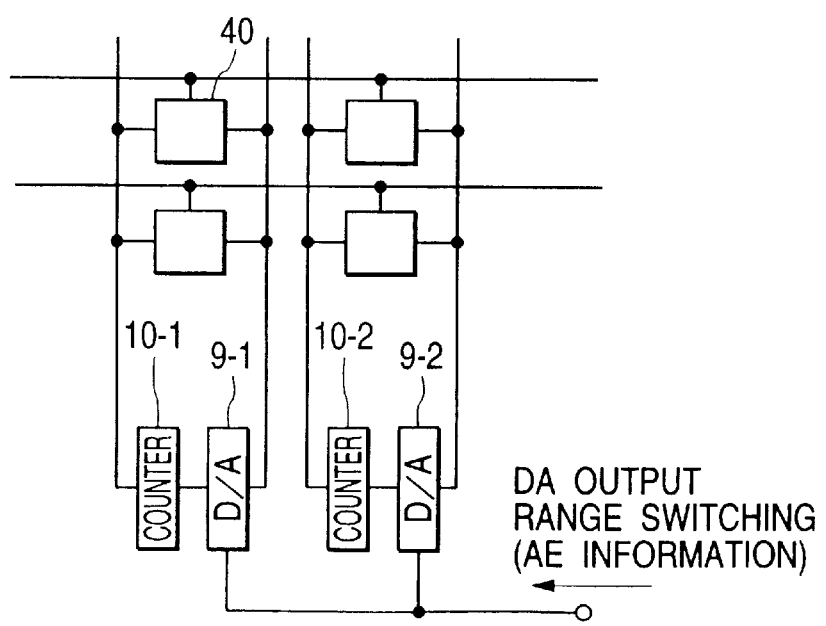
FIG. 46 is a circuit diagram of a D/A converter supplied with AE data as converter output range switching data.

Thereafter, similar to the operation of the circuit shown in FIG. 40, the counters 10 (10-1, 10-2, 10-3) start count operations. The D/A converters 9 (9-1, 9-2, 9-3) therefore lower their output voltages, and the comparators 11 detect potential changes on the vertical signal lines 12 when the operations of the counters 10 are stopped. A change amount from the count start to end is used as a digital output to complete an A/D conversion. FIG. 46 is a circuit diagram in which AE data is supplies to the D/A converters 9 (9-1, 9-2, 9-3) as the DA output range switching data. Reference numeral 40 represents a pixel.

Figure 42:
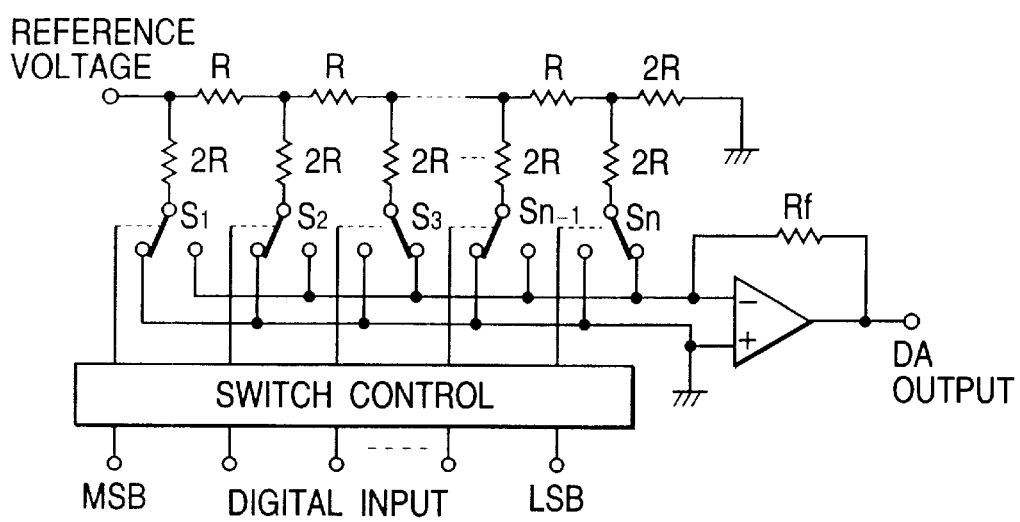
FIG. 42 is a circuit diagram showing an example of the structure of the D/A converter shown in FIGS. 39 and 40.

FIG. 42 is a circuit diagram showing an example of the structure of the D/A converter shown in FIGS. 39 and 40.

In this example of the structure, n-bit AD of an R-2R ladder type is constituted of 2n resistors and n switches. The reference voltage is changed by changing the resistance value of the ladder under the control of a switch controller. A ratio of the ladder resistance value to the amplifier resistance value $R_f$ corresponds to a DA output voltage. A type of a D/A conversion method is not limited only to the R-2R ladder type, but other types such as a capacitor array type may also be used.

Figure 43:
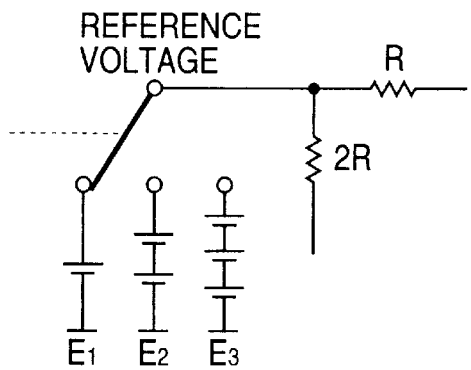
FIG. 43 is a diagram illustrating a method of switching a plurality of reference voltages (E1, E2 and E3) by a switch.
Figure 44:
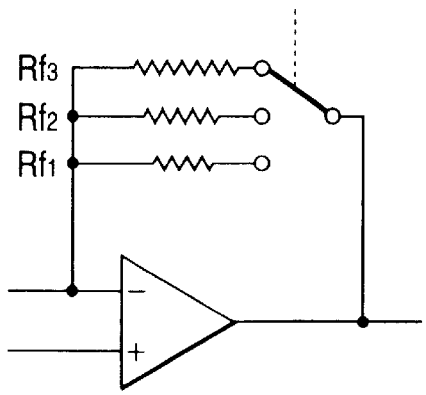
FIG. 44 is a diagram illustrating a method of switching a ratio of a ladder resistor value to a feedback resistor value Rf by changing the feedback resistor value Rf.

As a method of switching between DA output ranges, a method of switching between a plurality of reference voltages (E1, E2, E3) by a switch is illustrated in FIG. 43, and a method of switching a ratio between a ladder resistance value and the amplifier resistance value $R_f$ by changing the amplifier feedback resistor $R_f$ is illustrated in FIG. 44.

Figure 45:
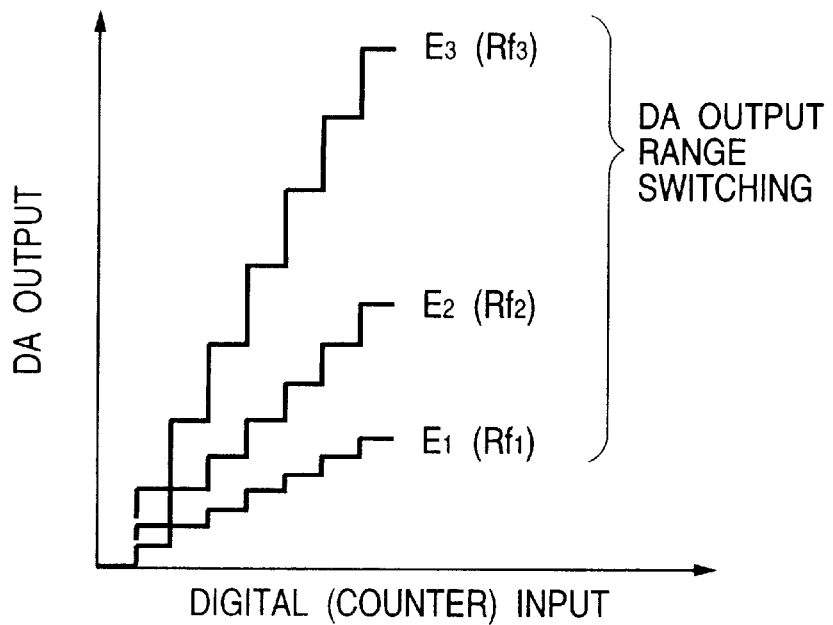
FIG. 45 is a graph showing a DA output when a D/A converter output range is switched by the method illustrated in FIG. 43 or 44.

FIG. 45 is a graph showing the DA output characteristics when the DA output range is changed by the method illustrated in FIGS. 43 or 44. The comparison reference voltage of the D/A converter may have knee characteristics or gamma characteristics so that the image pickup system can be simplified. If a color image pickup system is to be used, it is preferable to use both white balance to be described later and the gamma, or knee performance.

FIGS. 51A to 51D are graphs showing the characteristics according to other types of this embodiment. In accordance with the image data of an object, the change range or change weight of a sensor output signal level of A/D conversion or the number of bits of a digitalized output signal may be changed.

Figure 51A:
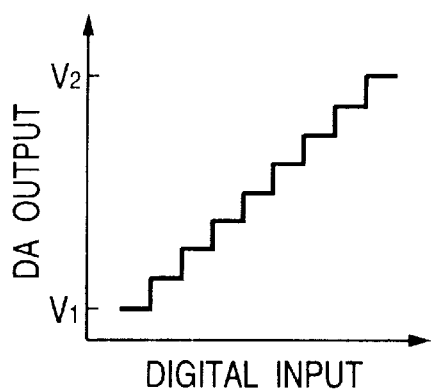
FIGS. 51A, 51B, 51C and 51D are graphs showing the characteristics of other types.

In FIG. 51A of FIGS. 51A to 51D, A/D conversion is performed linearly within the sensor DA output voltage range from V1 to V2.

Figure 51B:
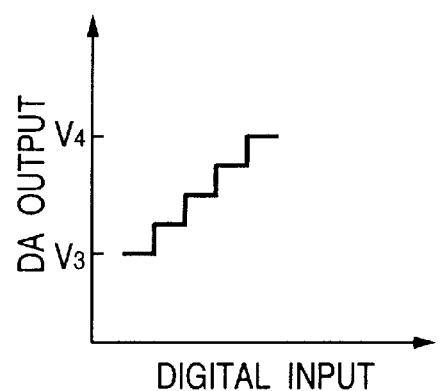

In FIG. 51B, although A/D conversion is performed linearly within the DA output voltage range from V3 to V4, the DA output voltage range is narrow, which is suitable for the case that a range of the amount of light reflected from an object is narrow, such as when original data, bar code data or the like is detected.

Figure 51C:
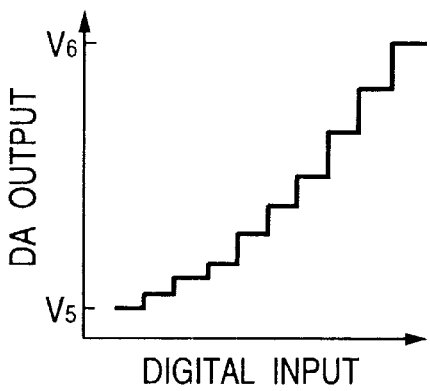

In FIG. 51C, the DA output voltage is converted non-linearly. For example, a step of the DA output voltage is made smaller near at V5 and large near at V6. In this case, A/D conversion in the gamma process of the sensor output signal is possible. Since the sensor signal is directly converted into digital signals, there is no quantization error and no increase in noises and a good image quality can be obtained.

Figure 51D:
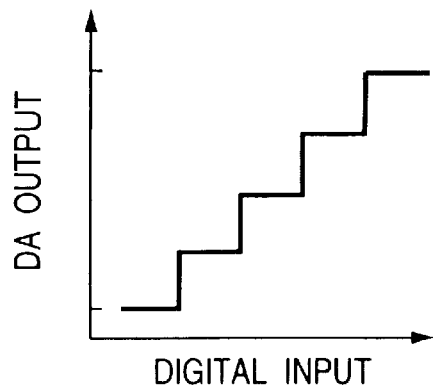

In FIG. 51D, A/D conversion is executed by using a smaller number of bits of a DA output voltage, which is suitable for the case when an original is detected or if the image pickup system is used for A/D conversion at a small number of bits.

Figure 47:
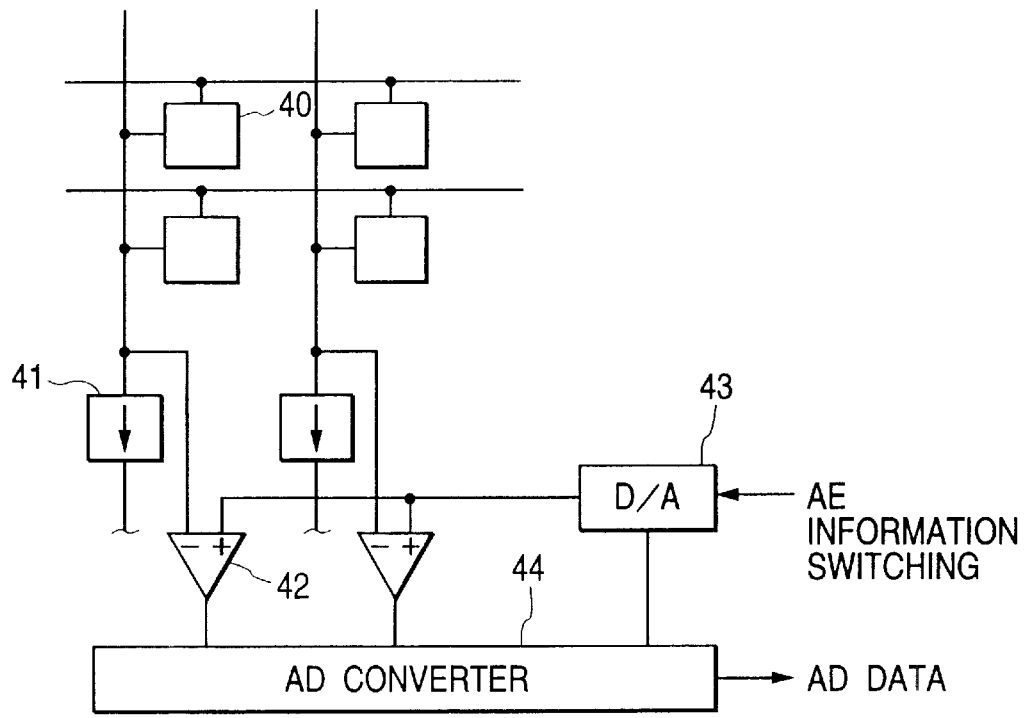
FIG. 47 is a circuit diagram of a solid image pickup device of another type.

FIG. 47 is a circuit diagram showing another type of the embodiment. In the embodiment described with reference to FIGS. 39 to 41, the variable range of an output level of a pixel signal is changed in accordance with DA output range switching data. In this embodiment, the variable range of a comparison reference voltage is changed in accordance with DA output range switching data.

Figure 48:
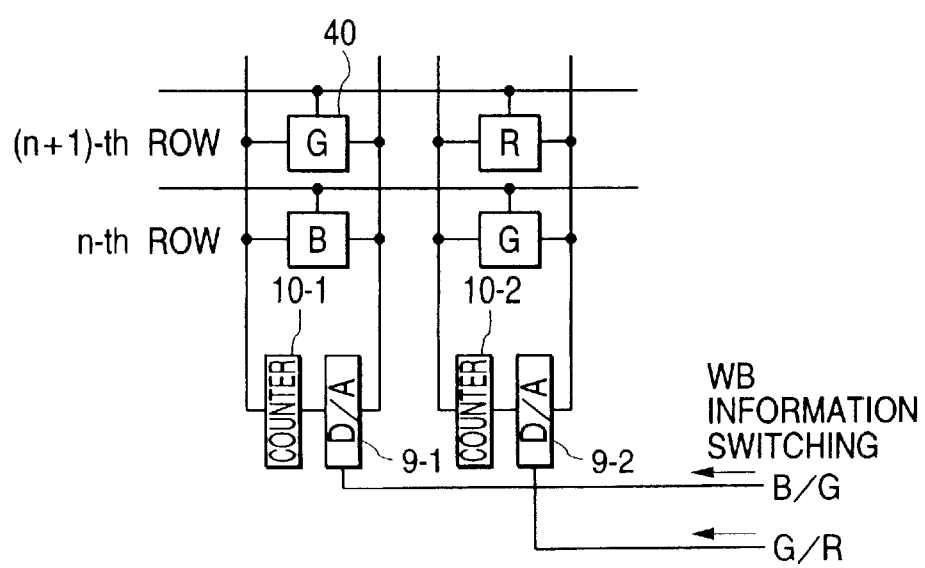
FIG. 48 is a circuit diagram of a color solid image pickup device.

As shown in FIG. 48, a comparator 42 compares a pixel signal of a pixel 40 in each column with a DA output voltage of a D/A converter 43, and an A/D converter 44 converts an analog output of the comparator 42 into a digital signal. The D/A converter 43 is applied with DA output range switching data (AE data) for switching the range of a ramp reference voltage. Reference numeral 41 represents a source follower circuit constituted together with the transistor of the pixel 40.

FIG. 48 is a circuit diagram for a color signal processing apparatus. In this embodiment, the circuit described in the embodiment shown in FIGS. 39 to 41 is applied. A variable range of the output level of a pixel signal is changed in accordance with white balance (WB) data.

R, G and B color filters are disposed in a mosaic shape over the pixels 40. A WB data switching signal for each color is supplied to each of D/A converters 9 (9-1,9-2, 9-3) of each pixel row (..., (n+1)-th row, n-th row) to switch the DA output range of each color and change the A/D conversion range of each color signal. This WB data is generated from the WB detection signal of the camera signal processing unit 120 shown in FIG. 38. The A/D conversion range of B and G signals is sequentially changed in the n-th row, and that of G and R signals is sequentially changed in the (n+1)-th row.

Figure 49:
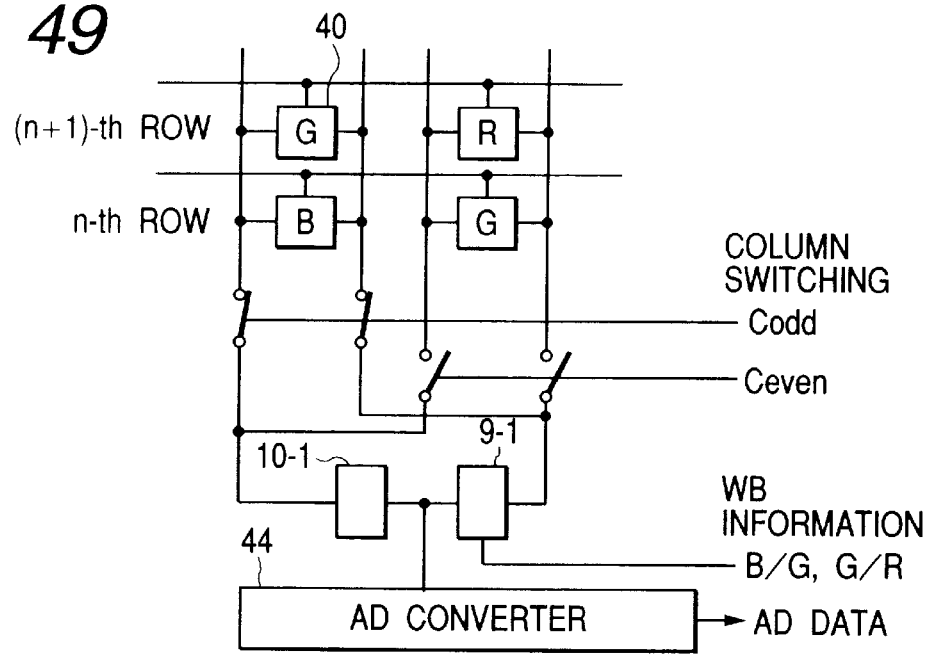
FIG. 49 is a circuit diagram of a color solid image pickup device of a color sequential output type.

FIG. 49 shows a type of the circuit applied to a color sequential output system.

Similar to the circuit shown in FIG. 48, R, G and B color filters are disposed in a mosaic shape over the pixels 40. In the n-th row, pixel signals of B signal columns are A/D converted into AD data and output, in response to a column switching control pulse Codd. Next, pixel signals of G signal columns are A/D converted into AD data and output, in response to a column switching control pulse Ceven. In this case, a WD data switching signal for each color is applied to the D/A converters 9 (9-1, 9-2, 9-3) to switch the DA output range for each color and change the A/D conversion range of each color signal.

As above, since the A/D conversion is performed in the unit of column, the number of A/D converter circuits can be reduced. A reduced circuit scale can improve the circuit characteristics and reduce a chip area.

Figure 50:
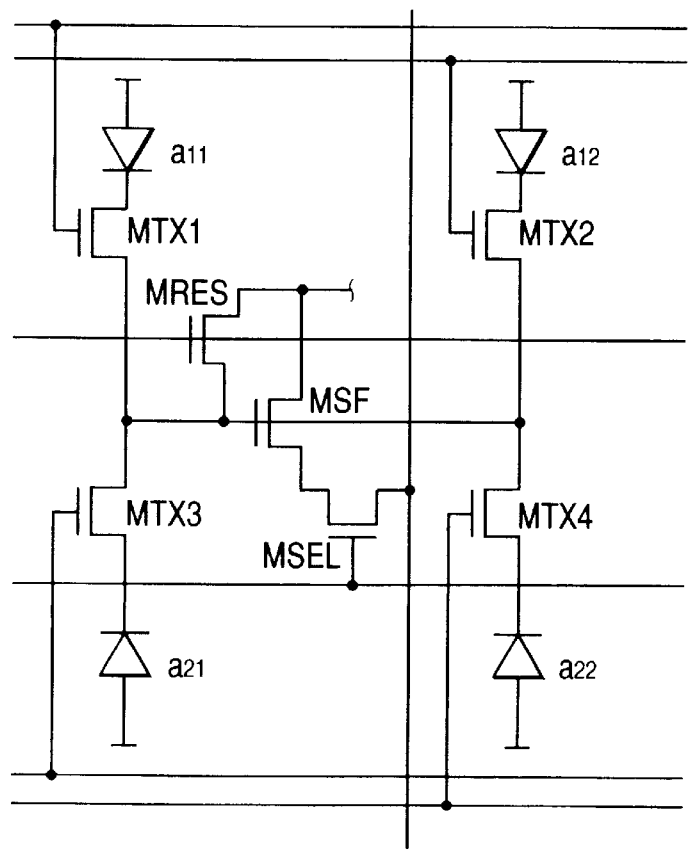
FIG. 50 is a circuit diagram showing an example of pixels using a common amplifier.

In the pixel unit, one common amplifier may be provided for a plurality of photoelectric conversion units. FIG. 50 is a circuit diagram of a common amplifier. As shown in FIG. 50, the circuit includes photodiodes or photoelectric conversion elements a11, a12, a21 and a22 of pixels, a common amplifying transistor MSF, transfer transistors MTX1 to MTX4 for transferring signal charges accumulated in the photodiodes to an input unit of the common amplifier, a reset transistor MRES for resetting the input unit of the common amplifier, and a select transistor MSEL for selecting pixels for the common amplifier. The transistors MSF and MSEL constitute a source follower circuit. In this circuit, signals of four pixels are output via the common amplifier, and the four pixels constitute one unit cell. One pixel includes the photodiode and transfer transistor and shares the common amplifier, reset transistor and select transistor. G filters are provided for the photodiodes a11 and a22, a B filter is provided for the photodiode a21, and an R filter is provided for the photodiode a12.

In this embodiment, the circuit structure is not limited to only that shown in FIG. 39. For example, the DA output range switching data may be input to the D/A converter 11 of the circuit shown in FIG. 21 of the seventh embodiment.

As described above, according to the tenth embodiment, the AD input voltage can be set in accordance with the image signal level. It is therefore possible to use the full performance of the A/D converter.

Since the scale of the A/D converter circuit can be reduced, manufacture yield can be improved and low cost can be realized. The feedback structure by a pixel and A/D converter unit improves the A/D conversion and the design without an analog gain circuit is possible.

A combination of white balance, gamma and knee functions allows a signal processing apparatus to be simplified.

Many widely different embodiments of the present invention may be constructed without departing from the spirit and scope of the present invention. It should be understood that the present invention is not limited to the specific embodiments described in the specification, except as defined in the appended claims.

What is claimed is:

1. A signal processing apparatus comprising:
   a plurality of circuit blocks, each circuit block including a signal source and an output transistor adapted to receive a signal generated by said signal source at a control electrode region and output a corresponding signal from a main electrode region; and
   an analog/digital converter circuit adapted to sequentially process the signal from each of said plurality of circuit blocks,
   wherein said analog/digital converter circuit comprises a reference transistor adapted to receive a reference level at a control electrode region and output a corresponding signal from a main electrode region and a digital output circuit adapted to output a digital signal,
   wherein said output transistor included in the selected circuit block and the reference transistor are an input unit constituting a part of a differential amplifier circuit, and
   wherein said digital output circuit outputs said digital signal in accordance with an output from said differential amplifier circuit.

2. A signal processing apparatus according to claim 1, wherein said signal source of said circuit block is a pixel including a photoelectric conversion unit.

3. A signal processing apparatus according to claim 2, wherein said pixels are arranged two-dimensionally and a plurality of said analog/digital converter circuits are arranged for sequentially processing signals from pixels of one column.

4. A signal processing apparatus according to claim 3, wherein said analog/digital converter circuit includes a counter which is controlled in accordance with a signal output from said output transistor and a signal output from said reference transistor, and the reference level is changed in accordance with a signal output from said counter.

5. A signal processing apparatus according to claim 2, further comprising:
an optical system adapted to focus light upon said pixel; and
a signal processing circuit adapted to process a signal output from said analog/digital converter circuit.

6. A signal processing apparatus according to claim 1, wherein said analog/digital converter circuit performs a comparison operation by changing, within variable range, levels of signals output from said output transistor and reference transistor, and outputs the digital signal in accordance with a comparison result, and the signal processing apparatus further comprises a control circuit for changing the variable range.

7. A signal processing apparatus according to claim 6, wherein said control circuit changes the variable range in accordance with exposure data.

8. A signal processing apparatus according to claim 6, wherein said control circuit changes the variable range in accordance with white balance data.

9. A signal processing apparatus according to claim 1, wherein said output transistor and reference transistor are field effect transistors of a same conductivity type and have approximately a same gate size.

10. A signal processing circuit comprising:
a circuit block including a signal source and an output transistor adapted to receive a signal from said signal source at a control electrode region and output a corresponding signal from a first main electrode region; and
an analog/digital converter circuit adapted to compare the signal output from the first main electrode region with a reference signal, control a level of a signal output from the first main electrode region of said output transistor in accordance with a comparison result, and output a digital signal in accordance with the comparison result.

11. A signal processing apparatus according to claim 10, wherein said analog/digital converter circuit controls a potential at a second main electrode region of said output transistor in accordance with the comparison result to thereby control the level of the signal output from the first main electrode region of said output transistor.

12. A signal processing apparatus according to claim 11, wherein the pixels are arranged two-dimensionally and a plurality of said analog/digital converter circuits are arranged for sequentially processing signals from pixels of one column.

13. A signal processing apparatus according to claim 10, wherein said signal source of said circuit block is a pixel including a photoelectric conversion unit.

14. A signal processing apparatus according to claim 13, further comprising:
an optical system adapted to focus light upon the pixel; and
a signal processing circuit adapted to process a signal output from said analog/digital converter circuit.

15. A signal processing apparatus according to claim 10, wherein said analog/digital converter circuit performs a comparison operation by changing, within a variable range, levels of signals output from said output transistor and reference transistor, and outputs the digital signal in accordance with a comparison result, and the signal processing apparatus further comprises a control circuit adapted to change the variable range.

16. A signal processing apparatus according to claim 15, wherein said control circuit changes the variable range in accordance with exposure data.

17. A signal processing apparatus according to claim 15, wherein said control circuit changes the variable range in accordance with white balance data.

18. A signal processing apparatus according to claim 10, wherein said analog/digital converter circuit includes a counter which is controlled in accordance with a signal output from said output transistor and a signal output from said reference transistor, and a level of the signal output from the first main electrode region of said output transistor is controlled in accordance with a signal output from the counter.

19. A signal processing apparatus comprising:
a plurality of pixels; and
an analog/digital converter circuit adapted to output a digital signal in accordance with a comparison result between a level of a pixel signal from each of said pixels and a comparison reference level,
wherein said analog/digital converter circuit includes a first control circuit which effects control so as to compare the level of the pixel signal with the comparison reference level while relatively changing the level of the pixel signal and the comparison level, and a second control circuit which changes a range of the relative change of the level of the pixel signal and the comparison reference level.

20. A signal processing apparatus according to claim 19, wherein said pixel includes a photoelectric conversion element and an output transistor adapted to amplify a signal from the photoelectric conversion element and output the signal as the pixel signal, the output transistor having a main electrode region for changing an output level of the pixel signal,
wherein the pixel signal level is changed by changing a control voltage applied to the main electrode region.

21. A signal processing apparatus according to claim 20, wherein the control voltage is output from the digital/analog converter circuit.

22. A signal processing apparatus according to claim 19, wherein said first control circuit changes, within the range, the comparison reference level and said second control circuit changes the range of the comparison reference level, and the comparison reference level is controlled by an output of a digital/analog converter circuit.

23. A signal processing apparatus according to claim 19, wherein the range is changed exposure data.

24. A signal processing apparatus according to claim 19, wherein the range is changed with white balance data.

* * * * *